US012763785B2

(12) United States Patent
Sakai

(10) Patent No.: US 12,763,785 B2
(45) Date of Patent: Oct. 13, 2026

(54) SEMICONDUCTOR DEVICE

(71) Applicant: Renesas Electronics Corporation, Tokyo (JP)

(72) Inventor: Iori Sakai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 103 days.

(21) Appl. No.: 18/905,245

(22) Filed: Oct. 3, 2024

(65) Prior Publication Data

US 2025/0119152 A1 Apr. 10, 2025

(30) Foreign Application Priority Data

Oct. 6, 2023 (JP) ................................ 2023-174228

(51) Int. Cl.
*H03M 1/06* (2006.01)

(52) U.S. Cl.
CPC ................................ *H03M 1/0682* (2013.01)

(58) Field of Classification Search
CPC ........... H03M 1/06; H03M 1/46; H03M 1/468
See application file for complete search history.

(56) References Cited

U.S. PATENT DOCUMENTS 3,133,266 A * 5/1964 Frishkopf .............. G06V 10/17 382/207
3,553,372 A * 1/1971 Wright .................... G10L 25/90 704/211
3,609,682 A * 9/1971 Mitchell ............... H03M 13/45 714/760
4,404,674 A * 9/1983 Rhodes ................. H03M 13/43 714/793
5,055,847 A * 10/1991 Rybicki .............. H03M 1/0682 341/162
5,757,366 A * 5/1998 Suzuki ..................... G09G 1/16 345/212
5,990,815 A * 11/1999 Linder ................ H03M 1/0641 341/131
6,037,891 A * 3/2000 Griph .................. H03M 1/0682 341/161

(Continued)

OTHER PUBLICATIONS

Jiang, T. et al. "Single-Channel, 1.25-GS/s, 6-bit, Loop-Unrolled Asynchronous SAR-ADC in 40nm-CMOS", IEEE CICC 2010, 4 pages.

*Primary Examiner* — Lam T Mai
(74) *Attorney, Agent, or Firm* — Rimon P.C.

(57) ABSTRACT

High speed of an analog-digital converter of a semiconductor device is achieved. A voltage quantizer circuit includes: a first comparator including a first input transistor inputting differential input voltages, and defining a value of a first bit of a digital signal; and a second comparator including a second input transistor being different from the first input transistor, and defining a value of a second bit of the digital signal. A correction code decision circuit decides a correction code for correcting a common-mode voltage of the differential input voltages, based on a conversion end signal output from the voltage quantizer circuit. A common-mode voltage regulator circuit regulates the common-mode voltage by adding or subtracting a corrected voltage based on the correction code to or from the differential input voltages.

19 Claims, 21 Drawing Sheets

(56) References Cited

U.S. PATENT DOCUMENTS

| | | | | |
|---|---|---|---|---|
| 7,339,512 | B2 * | 3/2008 | Gulati | H03M 1/168<br>341/172 |
| 7,924,192 | B2 * | 4/2011 | Iriguchi | H03M 3/474<br>341/143 |
| 9,806,728 | B1 * | 10/2017 | Sugimoto | H03M 1/0602 |
| 10,033,364 | B1 * | 7/2018 | Coban | H03K 5/1532 |
| 2006/0202721 | A1 * | 9/2006 | Partow | H03F 3/45183<br>327/65 |
| 2007/0126689 | A1 * | 6/2007 | Ishii | G09G 3/2011<br>345/100 |
| 2009/0289827 | A1 * | 11/2009 | Elliott | H03M 1/1245<br>341/161 |
| 2011/0316626 | A1 * | 12/2011 | Komatsu | H03F 3/2173<br>330/207 A |
| 2013/0201041 | A1 * | 8/2013 | Roze | H03M 9/00<br>341/100 |
| 2016/0056837 | A1 * | 2/2016 | Allen | H03K 19/017509<br>327/333 |
| 2016/0099722 | A1 * | 4/2016 | Lin | H03M 1/466<br>341/118 |
| 2018/0109231 | A1 * | 4/2018 | Kinyua | H03F 3/183 |
| 2021/0359700 | A1 * | 11/2021 | Chen | H03M 3/464 |
| 2022/0209780 | A1 * | 6/2022 | Sharma | H03M 1/08 |
| 2023/0344438 | A1 * | 10/2023 | Harris | H01M 1/164 |

* cited by examiner

SEMICONDUCTOR DEVICE

CROSS-REFERENCE TO RELATED APPLICATION

The disclosure of Japanese Patent Application No. 2023-174228 filed on Oct. 6, 2023, including the specification, drawings and abstract is incorporated herein by reference in its entirety.

TECHNICAL FIELD OF THE INVENTION

The present invention relates to a semiconductor device such as a semiconductor device including an analog-digital converter.

There is disclosed a technique listed below.

[Non-Patent Document 1] "Single-Channel, 1.25-GS/s, 6-bit, Loop-Unrolled Asynchronous SAR-ADC in 40 nm-COM," IEEE CICC 2010, Tao Jiang and other four.

BACKGROUND OF THE INVENTION

The Non-Patent Document 1 describes an asynchronous "successive approximation register"-"analog to digital converter" (SAR-ADC) capable of high-speed operations. The SAR-ADC includes as many comparators as bits of a digital signal. A comparator closer to the most significant bit outputs an activation signal to a comparator closer to the least significant bit when a comparison operation is completed. As a result, each comparator successively performs the comparison (approximation) operation in an order from the most significant bit toward the least significant bit.

SUMMARY OF THE INVENTION

For example, a system of successively defining each bit of a digital signal while repeatedly using one comparator is known as a typical configuration of the SAR-ADC. However, the system needs to reset the comparator for each repetition, and therefore, it may be difficult to achieve the high speed operation. Thus, as described in, for example, the Non-Patent Document 1, use of the asynchronous SAR-ADC, specifically a Loop-Unrolled SAR-ADC that does not need the repetitive operation because of including as many comparators as bits of the digital signal is considerable.

However, the use of such an asynchronous SAR-ADC causes a risk that is long comparison time of the comparators due to influence of a common-mode differential input voltage. Consequently, there is a risk that is an insufficient speed of the analog-digital converter.

Embodiments described below have been made under such circumstances, and other objects and novel characteristics will be apparent from the description of the specification and the drawings.

A semiconductor device according to an embodiment includes: a voltage quantizer circuit converting differential input voltages into a digital signal with a plurality of bits for every sampling period, and asserting a conversion end signal when completing a conversion operation; a correction code decision circuit receiving the conversion end signal as its input output from the voltage quantizer circuit; and a common-mode voltage regulator circuit regulating a common-mode voltage of the differential input voltages. The voltage quantizer circuit includes: a first comparator including a first input transistor receiving the differential input voltages as its input, and defining a first bit value of the digital signal; and a second comparator including a second input transistor different from the first input transistor, and defining a second bit value of the digital signal. The correction code decision circuit decides a correction code for correcting the common-mode voltage of the differential input voltages on the basis of the conversion end signal output from the voltage quantizer circuit. The common-mode voltage regulator circuit regulates the common-mode voltage by adding or subtracting a corrected voltage based on the correction code to or from the differential input voltages.

By use of the semiconductor device according to an embodiment, a speed of an analog-digital converter can be increased.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Although not particularly circuit elements limited, configuring functional blocks according to the embodiments are formed on a semiconductor substrate made of single-crystal silicon or the like by an integrated circuit technique such as well-known complementary MOS (CMOS) transistors and the like. In the embodiments, note that a metal oxide semiconductor field effect transistor (MOSFET, also referred to as MOS transistor) is used as an exemplary metal insulator semiconductor field effect transistor (MISFET). However, a non-oxide film is not excluded as a gate insulative film. Further, in the embodiments, an n-channel MOS transistor is referred to as nMOS transistor while a p-channel MOS transistor is referred to as pMOS transistor.

Hereinafter, the embodiments will be described in detail with reference to the accompanying drawings. Note that components having the same function are denoted by the same reference signs throughout all the drawings for describing the embodiments, and the repetitive description thereof will v be omitted. In addition, the description of the same or similar portions is not repeated in principle unless otherwise particularly required in the following embodiments.

First Embodiment

<Configuration of Semiconductor Device>

Figure 1:
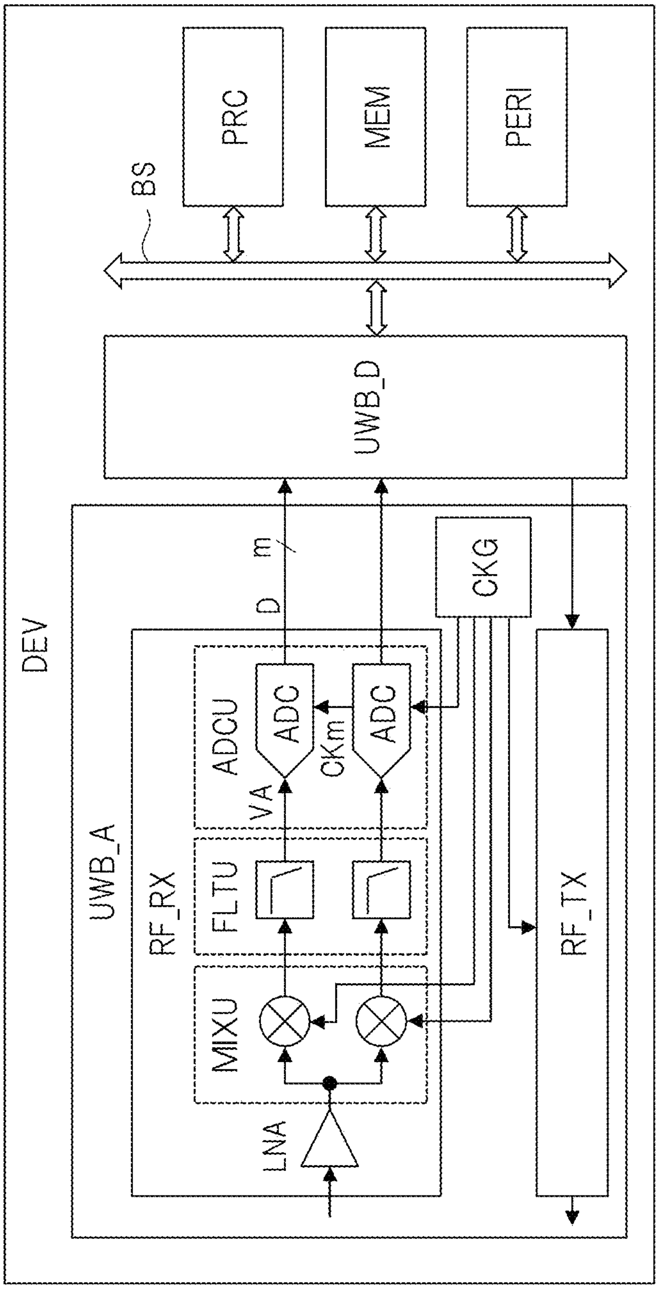
FIG. 1 is a block diagram illustrating an exemplary schematic configuration of a semiconductor device according to a first embodiment.

FIG. 1 is a block diagram illustrating an exemplary schematic configuration of a semiconductor device according to a first embodiment. A semiconductor device DEV illustrated in FIG. 1 is a system on chip (SoC) or the like which is used in, for example, a digital key for a vehicle, and which includes a wireless communication function based on ultra wide band (UWB) standards. Actually, the semiconductor device DEV is not limited in the configuration to FIG. 1, and has only to include at least an analog-digital converter ADC described later.

The semiconductor device DEV illustrated in FIG. 1 includes a processor PRC, a memory MEM, a peripheral circuit PERI, a UWB digital circuit UWB_D, a UWB analog circuit UWB_A, and a bus BS. The bus BS connects the processor PRC, the memory MEM, the peripheral circuit PERI, and the UWB digital circuit UWB_D to one another. The UWB analog circuit UWB_A is connected to the UWB digital circuit UWB_D.

The processor PRC is a central processing unit (CPU), a graphics processing unit (GPU), or the like. The memory MEM is made of a combination of a volatile memory such as static RAM (SRAM) and a nonvolatile memory such as flash memory or magnetoresistive RAM (MRAM). The peripheral circuit PERI includes various communication interfaces such as controller area network (CAN) interface or serial peripheral interface (SPI).

The UWB digital circuit UWB_D also serves as a baseband processing circuit in charge of processings in a baseband based on the UWB standards. The processings in the baseband include, for example, encoding/decoding, modulating/demodulating, encrypting/decrypting, and the like. The UWB analog circuit UWB_A also serves as a high-frequency circuit in charge of processings in a high-frequency band based on the UWB standards. The UWB analog circuit UWB_A includes a high-frequency transmission circuit RF_TX configured to process a transmission signal, a high-frequency reception circuit RF_RX configured to process a reception signal, and a clock generator circuit CKG.

The clock generator circuit CKG generates and supplies various clock signals used in a high-frequency band to the high-frequency transmission circuit RF_TX and the high-frequency reception circuit RF_RX. The high-frequency transmission circuit RF_TX includes a power amplifier and the like. The high-frequency transmission circuit RF_TX up-converts a transmission baseband signal output from the UWB digital circuit UWB_D into a high-frequency transmission signal made of short pulse by use of a clock signal output from the clock generator circuit CKG, and transmits the high-frequency transmission signal to an antenna not illustrated.

The high-frequency reception circuit RF_RX includes a low-noise amplifier LNA, a mixer unit MIXU, a filter unit FLTU, an analog-digital conversion unit ADCU, and the like. The low-noise amplifier LNA amplifies a high-frequency reception signal received by the antenna not illustrated. The mixer unit MIXU includes, for example, a plurality of mixer circuits, and down-converts an output signal from the low-noise amplifier LNA into a baseband reception signal by use of a clock signal output from the clock generator circuit CKG. The filter unit FLTU includes a plurality of filter circuits, and limits the baseband reception signal output from the mixer unit MIXU to a band of, for example, around 500 MHZ.

The analog-digital conversion unit ADCU includes a plurality of analog-digital converters ADC. The analog-digital converter ADC is, for example, the asynchronous SAR-ADC. The analog-digital converter ADC converts an analog input voltage VA output from the filter unit FLTU into a digital signal D of m-bit such as 6-bit. Then, the analog-digital converter ADC outputs the resultant digital signal D as digital data of the baseband reception signal to the UWB digital circuit UWB_D.

In this example, the analog-digital conversion unit ADCU includes two analog-digital converters ADC to perform conversion to a digital signal D of "2×m"-bit. To the analog-digital converter ADC, a master clock signal CKm is supplied from the clock generator circuit CKG. The analog-digital converter ADC generates, for example, a sampling clock signal of 1 GHz or 2 GHz based on the master clock signal CKm, and operates in synchronization with the sampling clock signal.

<Analog-Digital Converter>

Figure 2A:
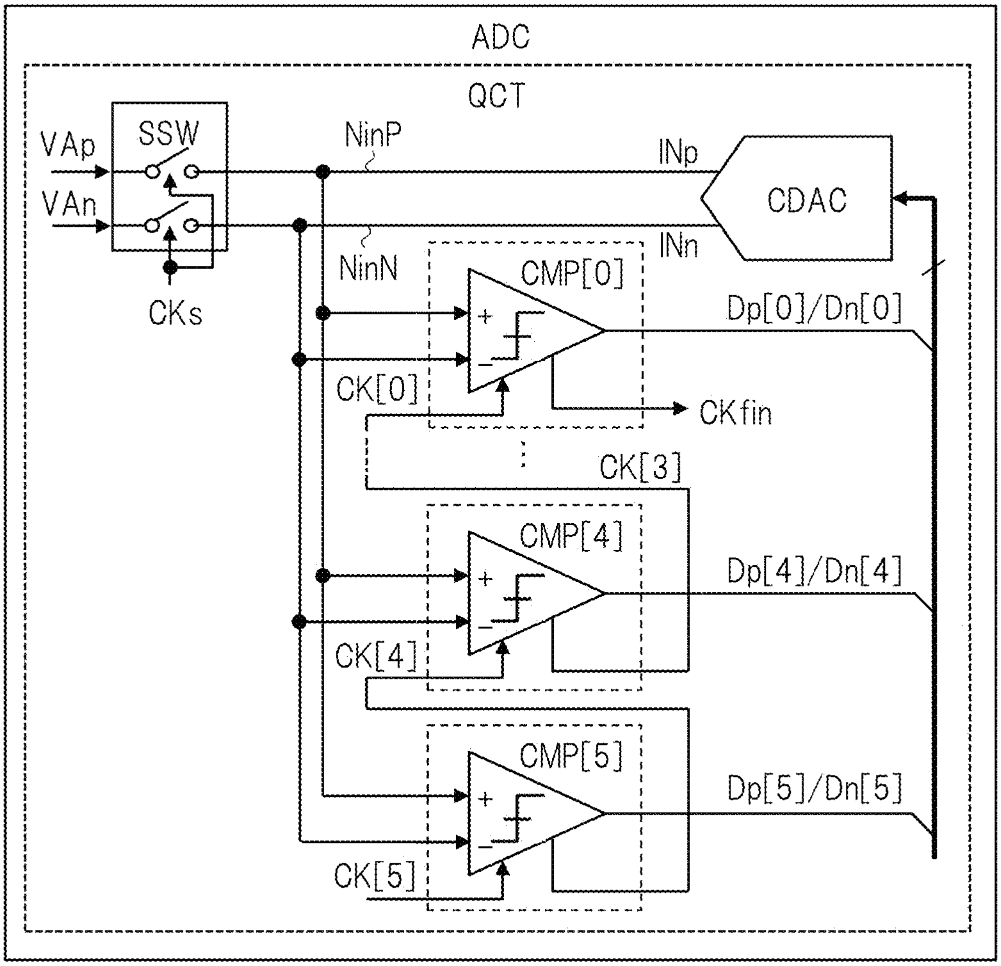
FIG. 2A is a circuit block diagram illustrating an exemplary configuration of a voltage quantizer circuit as a main body of an analog-digital converter of FIG. 1.
Figure 2B:
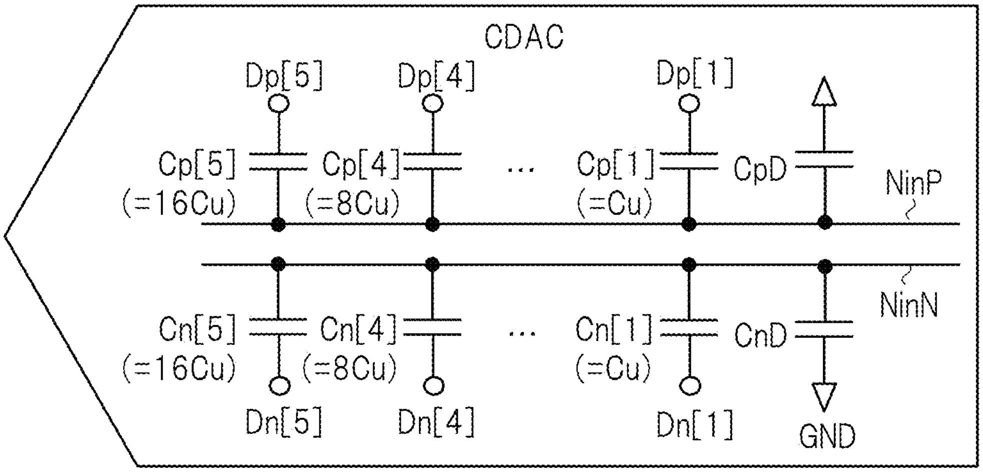
FIG. 2B is a circuit diagram illustrating an exemplary schematic configuration of the voltage quantizer circuit of FIG. 2A.
Figure 3:
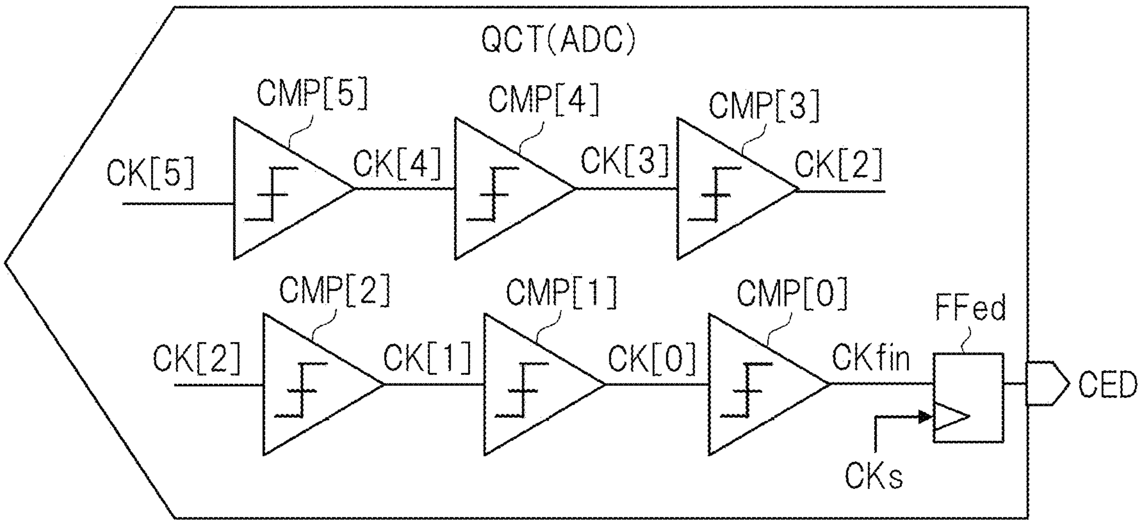
FIG. 3 is a circuit diagram illustrating an exemplary configuration of relationship of clock signals in the voltage quantizer circuit of FIG. 2.
Figure 4:
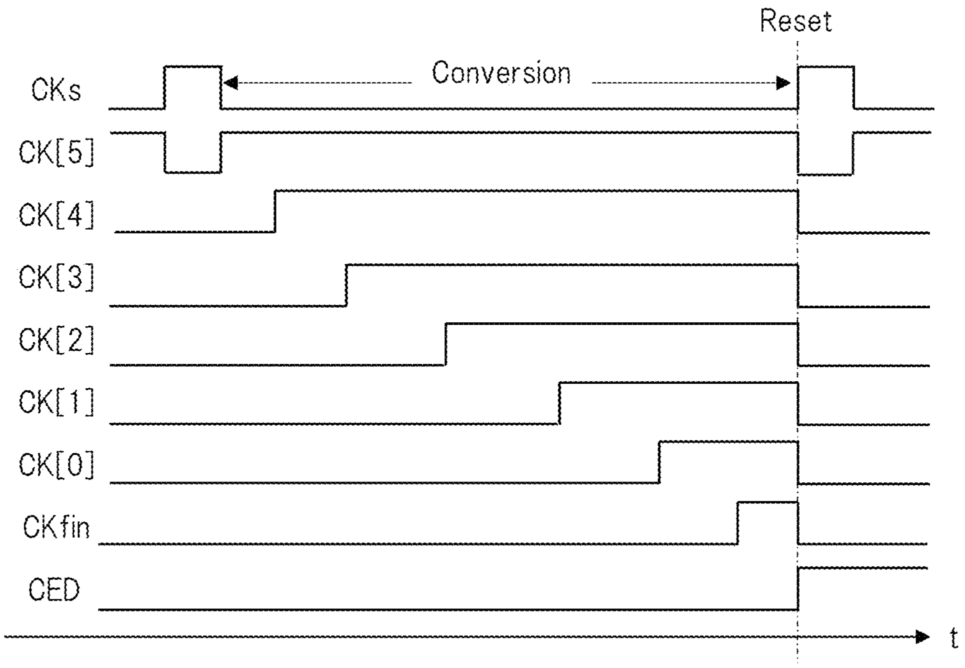
FIG. 4 is a timing chart illustrating an exemplary normal operation of the voltage quantizer circuit of FIGS. 2 and 3.

FIG. 2A is a circuit block diagram illustrating an exemplary configuration of a voltage quantizer circuit serving as a main body of the analog-digital converter of FIG. 1. FIG. 2B is a circuit diagram illustrating an exemplary schematic configuration of the voltage quantizer circuit of FIG. 2A. FIG. 3 is a circuit diagram illustrating an exemplary configuration of relationship of clock signals in the voltage quantizer circuit of FIG. 2. FIG. 4 is a timing chart illustrating an exemplary normal operation of the voltage quantizer circuit of FIGS. 2 and 3.

A voltage quantizer circuit QCT of FIG. 2A serves as the main body of the analog-digital converter ADC of FIG. 1, specifically the asynchronous Loop-Unroller SAR-ADC. The voltage quantizer circuit QCT includes a sampling switch SSW, a digital-analog converter CDAC, and "m" comparators that are six comparators CMP[0] to CMP[5] in this example. For differential input nodes NinP and NinN, specifically for conversion capacitors in the digital-analog converter CDAC, the sampling switch SSW samples positive-side and negative-side analog input voltages VAp and VAn to be the differential signals in an assertion period of a sampling clock signal CKs.

The comparators CMP[0] to CMP[5] define bit values of digital signals, in other words, values of positive-side digital signals Dp[0] to Dp[5] and values of negative-side digital signals Dn[0] to Dn[5] on the opposite side of the positive-side digital signals, respectively. The digital-analog converter CDAC adds or subtracts a predetermined voltage to or from the differential input voltages INp and INn of the differential input nodes NinP and NinN in accordance with the values of the digital signals Dp[0] to Dp[5] and Dn[0] to Dn[5]. As a result, the digital-analog converter CDAC updates the differential input voltages INp and INn.

The digital-analog converter CDAC is specifically, for example, of a capacitor type as illustrated in FIG. 2B. The digital-analog converter CDAC includes five capacitors Cp[1] to Cp[5] serving as conversion capacitors, a dummy capacitor CpD, five capacitors Cn[1] to Cn[5] serving as conversion capacitors, and a dummy capacitor CnD. However, the digital-analog converter is not limited to the capacitor type but may be, for example, of a resistor-type. Alternatively, the dummy capacitors CpD and CnD may be external capacitors.

One end of each of the five capacitors Cp[1] to Cp[5] and the dummy capacitor CpD is connected to the positive-side differential input node NinP. The positive-side digital signals Dp[1] to Dp[5] are applied to the other ends of the five capacitors Cp[1] to Cp[5], respectively. The other end of the dummy capacitor CpD is fixed at a ground power voltage GND.

Similarly, one end of each of the five capacitors Cn[1] to Cn[5] and the dummy capacitor CnD is connected to the negative-side differential input node NinN. The negative-side digital signals Dn[1] to Dn[5] are applied to the other ends of the five capacitors Cn[1] to Cn[5], respectively. The other end of the dummy capacitor CnD is fixed at the ground power voltage GND.

Each capacitor Cp[k] (k=1, 2, . . . , 5) has a capacitance value of, for example, "$2^{k-1}$×Cu". Similarly, each capacitor Cn[k] also has a capacitance value of "$2^{k-1}$×Cu." The capacitance values of the dummy capacitors CpD and CnD are defined to be the same value based on the ranges of the analog input voltages VAp and VAn or the like.

Each of the comparators CMP[0] to CMP[5] compares the zero voltage and a voltage difference "INp−INn" between the positive-side differential input voltage INp and the negative-side differential input voltage INn in terms of magnitude relationship. At this time, each comparator CMP [i] (i=5, 4, . . . , 0) starts the comparison operation in response to the assertion of the clock signal CK[i]. When completing the comparison operation, the comparator CMP [i] asserts a clock signal CK[i−1] for a next comparator CMP[i−1].

As a result, the comparison operation is successively performed in an order from the comparator CMP[5] to the comparator CMP[0]. As comparison results, each comparator CMP[i] outputs a positive-side digital signal Dp[i] and a negative-side digital signal Dn[i] on the opposite side of the positive-side digital signal. To the contrary, for every completion of the comparison operation of each comparator CMP[i], the digital-analog converter CDAC updates the differential input voltages INp and INn by adding or subtracting a predetermined voltage which is different by "$\frac{1}{2}^{n}$" to or from the differential input voltages INp and INn on the basis of the comparison-resultant digital signals Dp[i] and Dn[i], respectively.

The next comparator r CMP[i−1] performs the comparison operation on the differential input voltages INp and INn updated as described above. Consequently, the analog-digital converter ADC can convert the analog input voltages VAp and VAn serving as the differential signal, in other words, "VAp−VAn" into the 6-bit digital signals Dp[0] to Dp[5].

As illustrated in FIG. 4, more specifically, since the sampling clock signal CKs is input first, the positive-side differential input voltage INp is defined at the level of the positive-side analog input voltage VAp while the negative-side differential input voltage INn is defined at the level of the negative-side analog input voltage VAn. Subsequently, the clock signal CK[5] is asserted from the level "L" to the level "H" by a logic circuit not illustrated. As a result, the comparator CMP[5] starts the comparison operation.

A comparator CMP[5] shifts one of the digital signals Dp[5] and Dn[5] from, for example, the level "L" to the level "H", on the basis of the magnitude relationship between the zero voltage and the voltage difference "INp−INn" between the differential input voltages INp and INn in the comparison operation. When completing the comparison operation, the comparator CMP[5] asserts a clock signal CK[4].

To the contrary, in the digital-analog converter CDAC, the charge of the capacitor Cp[5] or Cn[5] is redistributed in response to the shift of one of the digital signals Dp[5] and Dn[5] to the level "H". Specifically, for example, via a control logic not illustrated, one of the digital signals Dp[5] and Dn[5] shifts from the level "L" to the level "H" while the other thereof shifts from the level "H" to the level "L". Consequently, one/the other of the differential input nodes NinP and NinN is electrically charged/discharged to add/subtract a predetermined voltage "Vref" to/from the differential input voltages INp and INn, in other words, the voltage difference "INp−INn". Note that the magnitude of "Vref" is regulated by the capacitance values of the dummy capacitors CpD and CnD.

While the differential input voltages INp and INn are updated as described above, the comparator CMP[4] starts the comparison operation in response to the assertion of the clock signal CK[4]. The comparator CMP[4] shifts one of the digital signals Dp[4] and Dn[4] from the level "L" to the level "H" on the basis of the magnitude relationship between the zero voltage and the voltage difference "INp−INn" in the comparison operation. Then, when completing the comparison operation, the comparator CMP[4] asserts a clock signal CK[3].

To the contrary, in the digital-analog converter CDAC, charges in the capacitors Cp[4] and Cn[4] are redistributed in response to the shift of one of the digital signals Dp[4] and Dn[4] to the level "H." Specifically, one of the digital signals Dp[4] and Dn[4] shifts from the level "L" to the level "H" while the other thereof shifts from the level "H" to the level "L". Consequently, a predetermined voltage "Vref/2" is added/subtracted to/from the differential input voltages INp and INn, in other words, the voltage difference "INp−INn".

Subsequently, the same processing is successively performed in the order to the comparator CMP[0] while the predetermined voltage is successively changed to "Vref/4," "Vref/8," . . . . The comparator CMP[0] outputs the digital signals Dp[0] and Dn[0] in the comparison operation, and asserts a clock signal CKfin when completing the comparison operation. Here, as illustrated in FIG. 3, the clock signal CKfin is input into a flip-flop circuit FFed additionally provided in the voltage quantizer circuit QCT. The flip-flop circuit FFed outputs a conversion end signal CED by latching the clock signal CKfin in response to the sampling clock signal CKs.

The conversion end signal CED indicates whether the conversion operation has been successfully completed by the analog-digital converter ADC. That is, the conversion operation has been successfully completed when the conversion end signal CED is asserted, in other words, at the time of the shift to the level "H" in this example. The analog input voltages VAp and VAn are sampled again in response to the sampling clock signal CKs. Further, the clock signals CK[5] to CK[0] and CKfin are negated to the level "L", and the digital signals Dp[1] to Dp[5] and Dn[1] to Dn[5] are returned to the initial values.

<Details of Comparator>

Figure 5A:
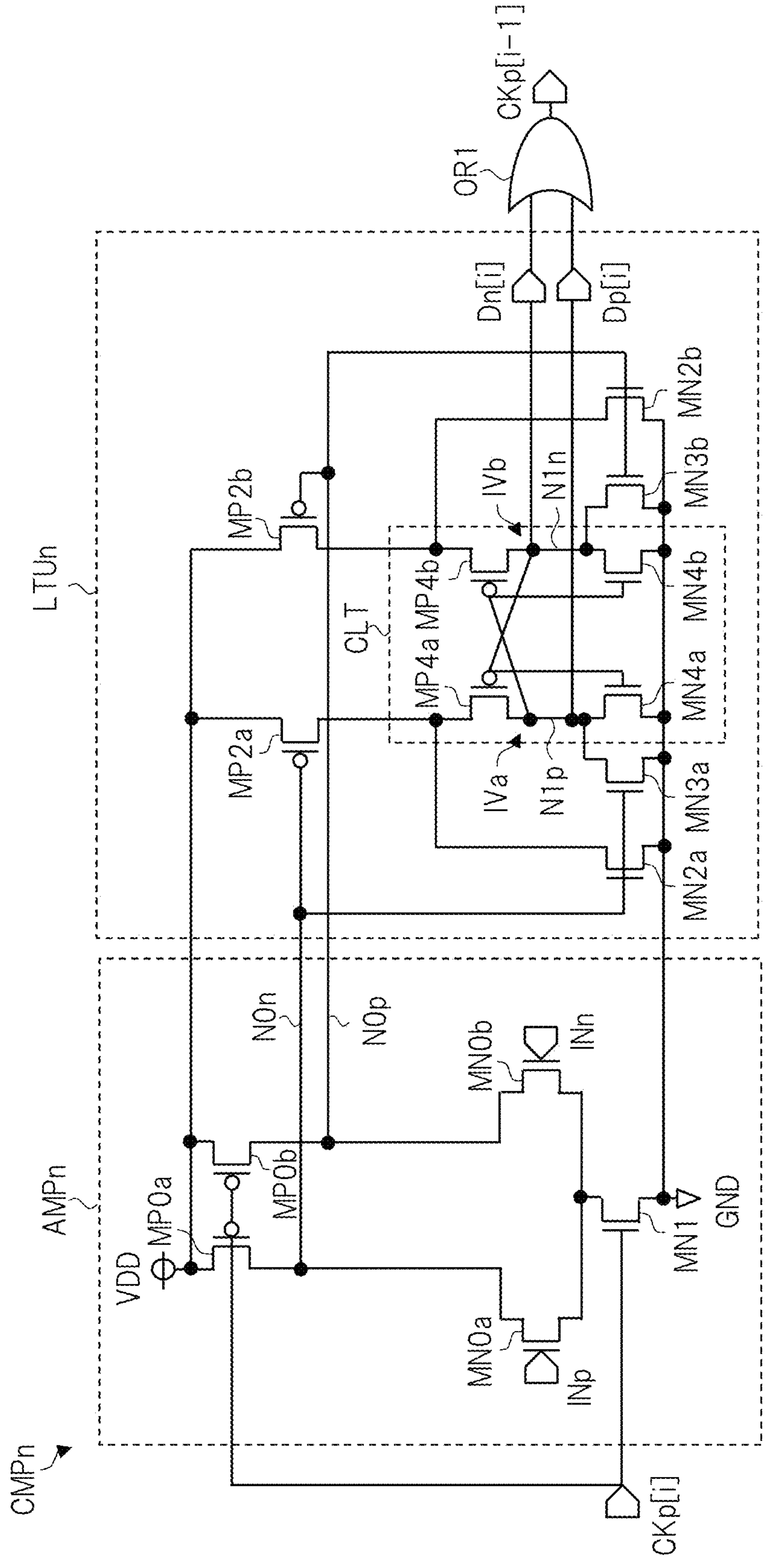
FIG. 5A is a circuit diagram illustrating an exemplary configuration of each comparator of FIG. 2A.

FIG. 5A is a circuit diagram illustrating an exemplary configuration of each comparator of FIG. 2A. FIG. 5A illustrates an n-channel comparator CMPn including n-channel transistors serving as initial input transistors (first and second input transistors). The comparator CMPn illustrated in FIG. 5A is also referred to as a dynamic comparator, and operates at low consumed power in synchronization with a positive-side clock signal CKp[i].

The comparator CMPn includes an amplifier circuit AMPn, a latch circuit unit LTUn, and an OR gate OR1. The amplifier circuit AMPn differentially amplifies the differential input voltages INp and INn. The latch circuit unit LTUn outputs a positive-side digital signal Dp[i] and a negative-side digital signal Dn[i] by latching an output signal from the amplifier circuit AMPn. The OR gate OR1 generates a next positive-side clock signal CKp[i−1] by performing an OR operation to the digital signals Dp[i] and Dn[i].

Specifically, the amplifier circuit AMPn includes nMOS transistors MN0*a*, MN0*b*, and MN1 and pMOS transistors MP0*a* and MP0*b*. The nMOS transistors MN0*a* and MN0*b* are initial input transistors (first and second input transistors) configuring a differential pair. The positive-side/negative-side differential input voltages INp/INn are input into the nMOS transistors MN0*a*/MN0*b*, respectively.

In a period in which the clock signal CKp[i] is at the level "L", the pMOS transistors MP0*a* and MP0*b* pre-charge initial output nodes N0*n* and N0*p* serving as drains of the nMOS transistors MN0*a* and MN0*b* to a power voltage VDD. In a period in which the clock signal CKp[i] is at the level "H", the nMOS transistor MN1 connects sources of the nMOS transistors MN0*a* and MN0*b* to a ground power voltage GND to activate the amplifier circuit AMPn.

The latch circuit unit LTUn includes nMOS transistors MN2*a*, MN3*a*, MN2*b*, and MN3*b*, pMOS transistors MP2*a* and MP2*b*, and a CMOS latch circuit CLT. The CMOS latch circuit CLT includes a CMOS inverter IVa made of a pMOS transistor MP4*a* and an nMOS transistor MN4*a* and a CMOS inverter IVb made of a pMOS transistor MP4*b* and an nMOS transistor MN4*b*.

The input of one of the CMOS inverters IVa and IVb is connected to the output of the other thereof. That is, a latch node N1*p* serving as the output node of the CMOS inverter IVa also serves as the input node of the CMOS inverter IVb. Similarly, a latch node N1*n* serving as the output node of the CMOS inverter IVb also serves as the input node of the CMOS inverter IVa. The positive-side digital signal Dp[i] is output to the latch node N1*p*, and the negative-side digital signal Dn[i] is output to the latch node N1*n*.

The pMOS transistor MP2*a* and the nMOS transistor MN2*a* configure a CMOS inverter. A negative-side output signal at the output node N0*n* is input into the CMOS inverter, and a high-potential side power voltage of the CMOS inverter IVa in the CMOS latch circuit CLT is defined in accordance with the input level. Similarly, the pMOS transistor MP2*b* and the nMOS transistor MN2*b* configure a CMOS inverter. A positive-side output signal at the output node N0*p* is input into the CMOS inverter, and a high-potential side power voltage of the CMOS inverter IVb in the CMOS latch circuit CLT is defined in accordance with the input level.

A negative-side output signal at the output node N0*n* is input into the nMOS transistor MN3*a* while a positive-side output signal at the output node N0*p* is input into the nMOS transistor MN3*b*. The nMOS transistor MN3*a* connects the latch node N1*p* to the ground power voltage GND when receiving the level "H" as its input. Similarly, the nMOS transistor MN3*b* connects the latch node N1*n* to the ground power voltage GND when receiving the level "H" as its input.

The operations performed by the comparator CMPn as described above are classified into an operation in a reset period in which the clock signal CKp[i] is at the level "L" and an operation in a comparison period after the clock signal CKp[i] shifts from the level "L" to the level "H." In the reset period, the nMOS transistor MN1 is turned OFF while the pMOS transistors MP0*a* and MP0*b* are turned ON, and therefore, both the output nodes N0*n* and N0*p* are pre-charged to the level "H." Accordingly, the nMOS transistors MN3*a* and MN3*b* are turned ON, and therefore, both the digital signals Dp[i] and Dn[i] are at the level "L." The clock signal CKp[i−1] output from the OR gate OR1 is also at the level "L."

In the comparison period after that period, the nMOS transistor MN1 is turned ON while the pMOS transistors MP0*a* and MP0*b* are turned OFF. As a result, in the amplifier circuit AMPn, the differential amplification is performed by the input transistors (MN0*a* and MN0*b*) serving as the differential pair in accordance with the voltage difference "INp−INn" between the differential input voltages INp and INn. For example, in a case of "INp>INn," the potential of the output node N0*n* more rapidly decreases from the level "H" to the level "L" than the potential of the output node N0*p*.

Consequently, to the CMOS inverter IVa in the CMOS latch circuit CLT, the power voltage VDD is supplied as a high-potential side power voltage via the CMOS inverter made of the pMOS transistor MP2*a* and the nMOS transistor MN2*a*. To the contrary, to the CMOS inverter IVb in the CMOS latch circuit CLT, the ground power voltage GND is supplied as a high-potential side power voltage via the CMOS inverter made of the pMOS transistor MP2*b* and the nMOS transistor MN2*b*.

As a result, the pMOS transistor MP4*a* is turned ON, and the digital signal Dp[i] at the latch node N1*p* shifts from the level "L" to the level "H." To the contrary, to the CMOS inverter IVb in the CMOS latch circuit CLT, the ground power voltage GND is supplied as a high-potential side power voltage, and thus, the digital signal Dn[i] at the latch node N1*n* is kept at the level "L." The clock signal CKp[i−1] output from the OR gate OR1 is asserted to the level "H" when the digital signal Dp[i] shifts to the level "H", in other words, at the time of the completion of the comparison operation.

Figure 5B:
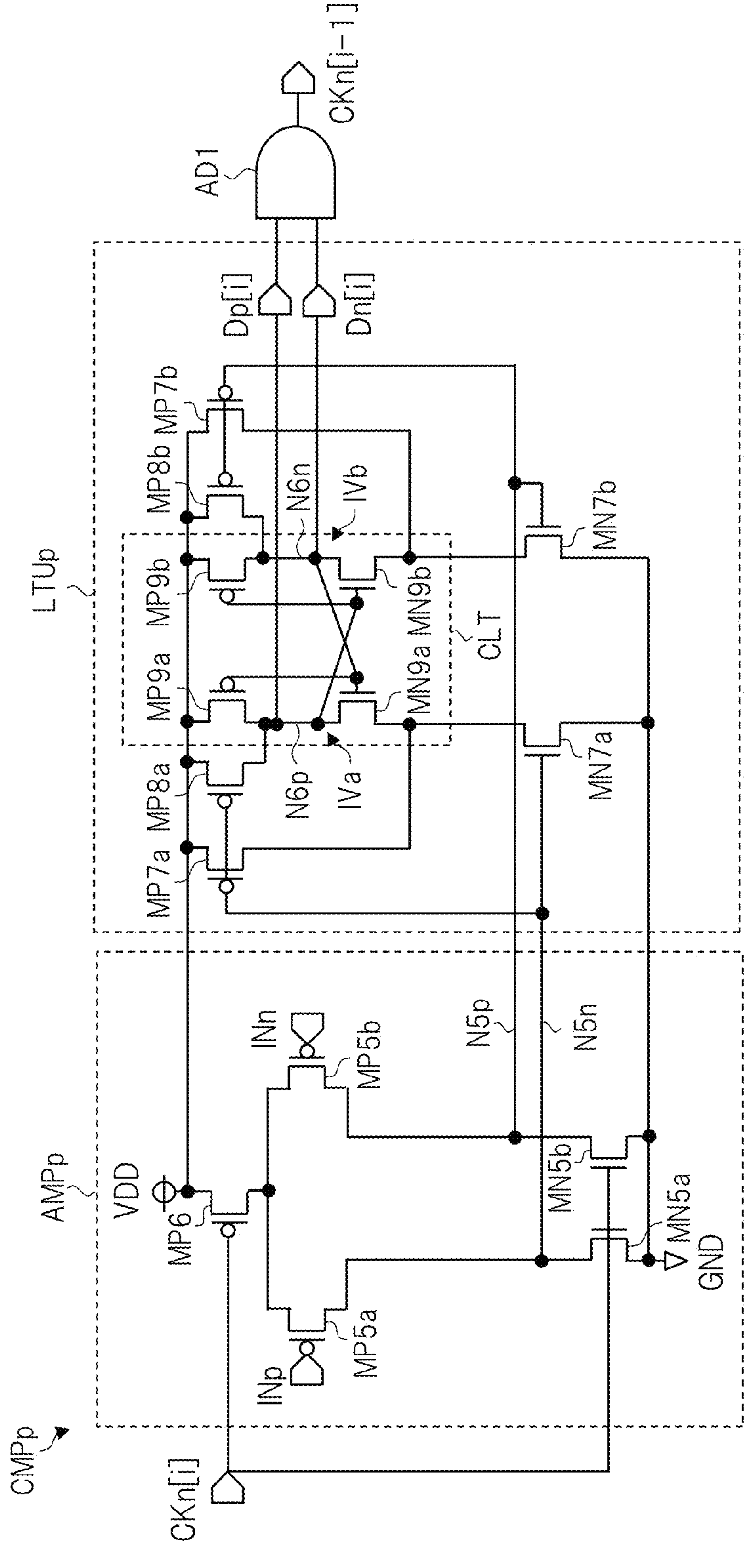
FIG. 5B is a circuit diagram illustrating an exemplary configuration of each comparator different from that of FIG. 5A.

FIG. 5B is a circuit diagram illustrating an exemplary configuration of each comparator different from that of FIG. 5A. As different from FIG. 5A, FIG. 5B illustrates a p-channel comparator CMPp including p-channel transistors as initial input transistors (that are a second or a first input transistor). As different from FIG. 5A, the comparator CMPp illustrated in FIG. 5B operates in synchronization with a negative-side clock signal CKn[i].

The comparator CMPp includes an amplifier circuit AMPp, a latch circuit unit LTUp, and an AND gate AD1. The amplifier circuit AMPp and the latch circuit unit LTUp are configured as similar to FIG. 5A. The AND gate AD1 generates a next negative-side clock signal CKn[i−1] by performing an AND operation to the digital signals Dp[i] and Dn[i] output from the latch circuit unit LTUp.

Specifically, the amplifier circuit AMPp and the latch circuit unit LTUp are configured such that the power voltage VDD and the ground power voltage GND are exchanged while the nMOS transistors and the pMOS transistors are exchanged in the configuration of FIG. 5A. Accordingly, the amplifier circuit AMPp includes pMOS transistors MP5*a*, MP5*b*, and MP6 and nMOS transistors MN5*a* and MN5*b*. The pMOS transistor MP5*a* or MP5*b* is an initial input transistor (second or first input transistor) configuring a differential pair. The positive-side/negative-side differential input voltages INp/INn are input into the pMOS transistors MP5*a*/MP5*b*, respectively.

The nMOS transistors MN5*a* and MN5*b* pre-charge initial output nodes N5*n* and N5*p* to the ground power voltage GND in a period in which the clock signal CKn[i] is at the level "H", in other words, a period in which the clock signal CKp[i] is at the level "L". The pMOS transistor MP6 connects the sources of the pMOS transistors MP5*a* and MP5*b* to the power voltage VDD to activate the amplifier circuit AMPp in a period in which the clock signal CKn[i] is at the level "L", in other words, a period in which the clock signal CKp[i] is at the level "H".

The latch circuit unit LTUp includes pMOS transistors MP7*a*, MP8*a*, MP7*b*, and MP8*b*, nMOS transistors MN7*a* and MN7*b*, and a CMOS latch circuit CLT. The CMOS latch circuit CLT includes a CMOS inverter IVa made of a pMOS transistor MP9*a* and an nMOS transistor MN9*a* and a CMOS inverter IVb made of a pMOS transistor MP9*b* and an nMOS transistor MN9*b*.

A latch node N6*p* serving as the output node of the CMOS inverter IVa also serves as the input node of the CMOS inverter IVb. Similarly, a latch node N6*n* serving as the output node of the CMOS inverter IVb also serves as the input node of the CMOS inverter IVa. A positive-side digital signal Dp[i] is output to the latch node N6*p* while a negative-side digital signal Dn[i] is output to the latch node N6*n*.

The pMOS transistor MP7*a* and the nMOS transistor MN7*a* configure a CMOS inverter. A negative-side output signal at the output node N0*n* is input into the CMOS inverter, and a low-potential side power voltage of the CMOS inverter IVa in the CMOS latch circuit CLT is defined in accordance with the input level. Similarly, the pMOS transistor MP7*b* and the nMOS transistor MN7*b* configure a CMOS inverter. A positive-side output signal at the output node N0*p* is input into the CMOS inverter, and a low-potential side power voltage of the CMOS inverter IVb in the CMOS latch circuit CLT is defined in accordance with the input level.

A negative-side output signal at the output node N5*n* is input into the pMOS transistor MP8*a* while a positive-side output signal at the output node N5*p* is input into the pMOS transistor Mp8*b*. The pMOS transistor MP8*a* connects the latch node N6*p* to the power voltage VDD when receiving the level "L" as its input. Similarly, the pMOS transistor MP8*b* connects the latch node N6*n* to the power voltage VDD when receiving the level "L" as its input.

The operations of the comparator CMPp of FIG. 5B are almost similar to those of the comparator CMPn of FIG. 5A. Differences therebetween are that both the digital signals Dp[i] and Dn[i] are at the level "H" in the reset period. In the comparison period, one of the digital signals Dp[i] and Dn[i] shifts from the level "H" to the level "L". Accordingly, the negative-side clock signal CKn[i−1] output from the AND gate AD1 is asserted from the level "H" to the level "L." In other words, the positive-side clock signal CKp[i−1] is asserted from the level "L" to the level "H" as similar to the case of FIG. 5A.

<Problems of Voltage Quantizer Circuit>

For example, the UWB needs to process a signal with a frequency band of around 500 MHz. Thus, a high conversion speed that is, for example, 1 GS/s or more is required in the analog-digital converters ADC of FIG. 1. Such a conversion speed requirement can be ideally met under use of the voltage quantizer circuit QCT as illustrated in FIG. 2A. However, actually, there is a risk of prevention of the high speed due to influence of the common-mode voltage of the differential input voltages.

Figure 17A:
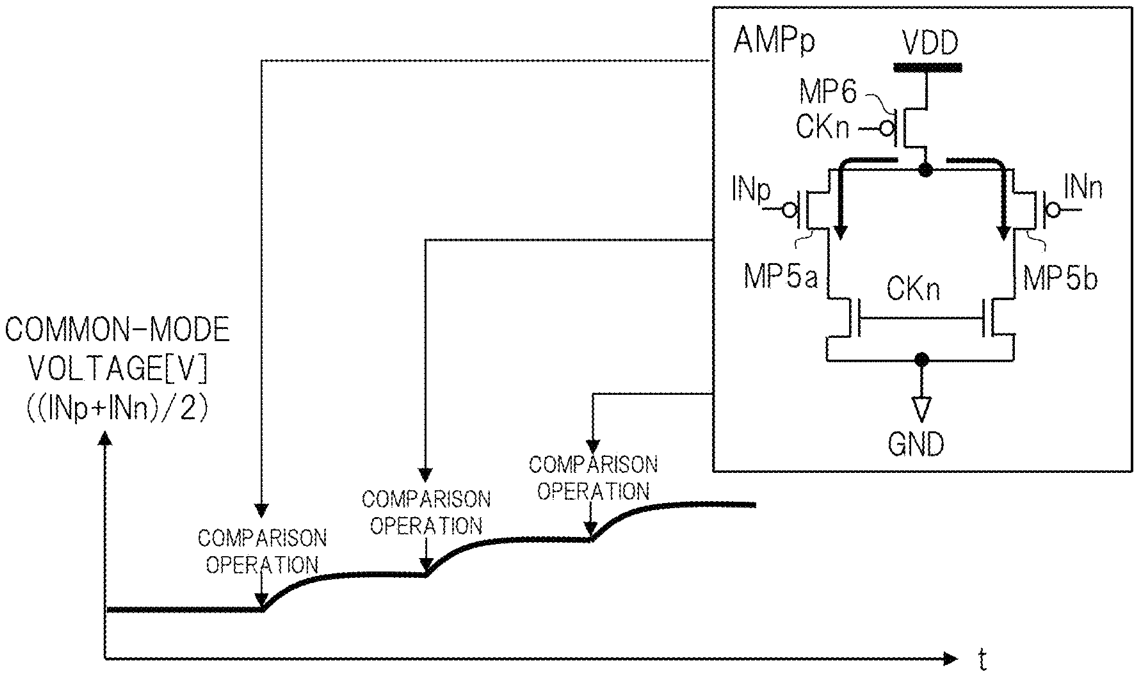
FIG. 17A is a schematic diagram illustrating an exemplary problem in a case of simple use of the voltage quantizer circuit of FIG. 2A.
Figure 17B:
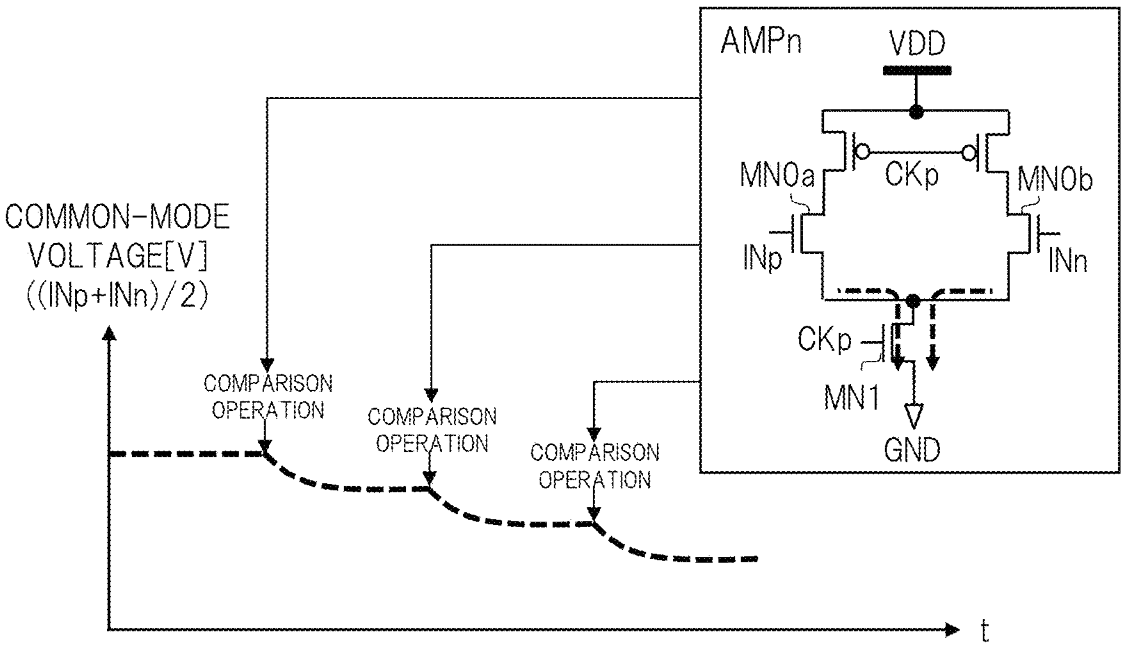
FIG. 17B is a schematic diagram illustrating an exemplary problem in a case of simple use of the voltage quantizer circuit of FIG. 2A.

FIGS. 17A and 17B are schematic diagrams illustrating an exemplary problem in a case of simple use of the voltage quantizer circuit of FIG. 2A. FIG. 17A illustrates an exemplary operation in a case in which all the comparators CMP[0] to CMP[5] in the voltage quantizer circuit QCT are made of p-channel comparators CMPp of FIG. 5B. To the contrary, FIG. 17B illustrates an exemplary operation in a case in which all the comparators CMP[0] to CMP[5] in the voltage quantizer circuit QCT are made of n-channel comparators CMPn of FIG. 5A.

As illustrated in FIG. 17A, when only the p-channel comparators CMPp are used, the common-mode voltage of the differential input voltages is increased by the amplifier circuit AMPp in the comparator CMPp for every comparison operation. Specifically, electric current output from the power voltage VDD flows to the pMOS transistors MP5*a* and MP5*b* via the pMOS transistor MP6 in response to the shift of the negative-side clock signal CKn to the level "L." As a result, upward kickback phenomena may be caused in the differential input voltages INp and INn via a gate-source capacitance or a gate-drain capacitance of the pMOS transistors MP5*a* and MP5*b*. The common-mode voltage is defined by "(INp+INn)/2."

To the contrary, as illustrated in FIG. 17B, when only the n-channel comparators CMPn are used, the common-mode voltage of the differential input voltages is decreased by the amplifier circuit AMPn in the comparator CMPn for every comparison operation. Specifically, electric current output from the drains of the nMOS transistors MN0*a* and MN0*b* pre-charged at the power voltage VDD flows to the ground power voltage GND via the nMOS transistor MN1 in response to the shift of the positive-side clock signal CKp to the level "H." As a result, downward kickback phenomena may be caused in the differential input voltages INp and INn via a gate-source capacitance or a gate-drain capacitance of the nMOS transistors MN0*a* and MN0*b*.

Figure 18:
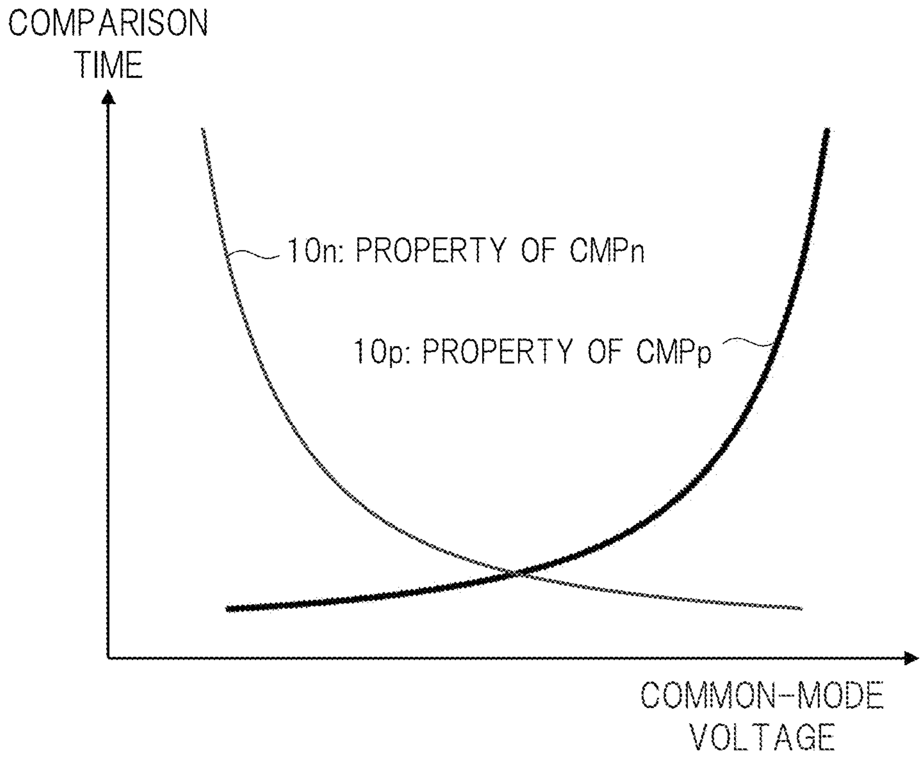
FIG. 18 is a schematic diagram illustrating an exemplary relationship between the common-mode voltage of the differential input voltages and comparison time in the voltage quantizer circuit of FIG. 2A.

FIG. 18 is a schematic diagram illustrating an exemplary relationship between the common-mode voltage of the differential input voltages and the comparison time in the voltage quantizer circuit of FIG. 2A. The lower the common-mode voltage is, the higher the drive capability of the pMOS transistors MP5*a* and MP5*b* serving as the input transistors in the amplifier circuit AMPp is, and the higher the operation speed thereof is. To the contrary, the higher the common-mode voltage is, the higher the drive capability of the nMOS transistors MN0*a* and MN0*b* serving as the input transistors in the amplifier circuit AMPn is, and the higher the operation speed thereof is.

As a result, as illustrated in FIG. 18, the comparison time of the comparators CMPp and CMPn largely depends on the common-mode voltage. Specifically, the higher the common-mode voltage is, the exponentially longer the comparison time of the comparator CMPp is, as indicated by property 10*p*. To the contrary, the lower the common-mode voltage is, the exponentially longer the comparison time of the comparator CMPn is, as indicated by property 10*n*. Consequently, when only the comparators of one type are used, there is a risk that is the excessive long comparison time due to the increased or decreased common-mode voltage as illustrated in FIG. 17A or 17B.

Figure 19:
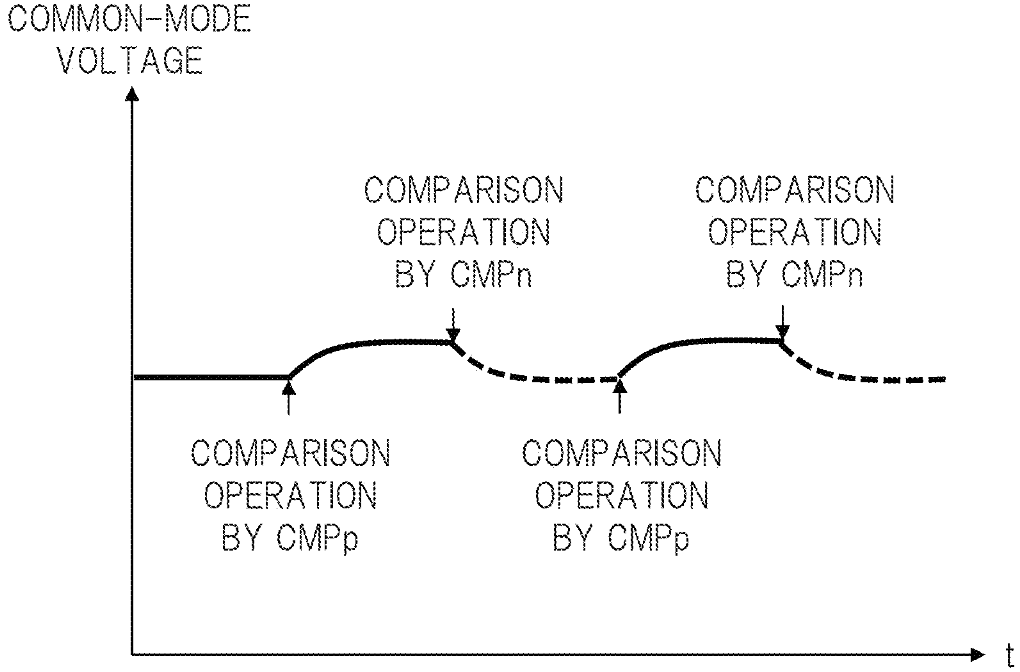
FIG. 19 is a schematic diagram illustrating an exemplary operation in a case of a devised configuration of the group of comparators in the voltage quantizer circuit of FIG. 2A.

FIG. 19 is a schematic diagram illustrating an exemplary operation in a case of the devised configuration of the group of comparators in the voltage quantizer circuit of FIG. 2A. FIG. 19 illustrates an exemplary operation in a case in which p-channel comparators CMPp and n-channel comparators CMPn are alternately arranged as the comparators CMP[5] to CMP[0] in the voltage quantizer circuit QCT. Since the p-channel comparators CMPp and the n-channel comparators CMPn are alternately arranged as described above, the variation of the common-mode voltage can be canceled. Consequently, the excessive long comparison time can be prevented.

The voltage quantizer circuit QCT of FIG. 2A is of a system of successively operating the plurality of comparators CMP[5] to CMP[0]. Thus, the conversion time of the analog-digital converter ADC is occupied by the comparison time of the comparators CMP[5] to CMP[0]. The use of the system of FIG. 19 can suppress the variations in the common-mode voltage to some extent, and therefore, can prevent the phenomena that is the excessive long comparison time, and eventually the excessive long conversion time of the analog-digital converter ADC. However, in order to further reduce the conversion time of the analog-digital converter ADC, the initial value of the common-mode voltage provided before starting the series of comparison operations is important in addition to the suppression of the variation in the common-mode voltage due to the comparison operations.

Figure 20A:
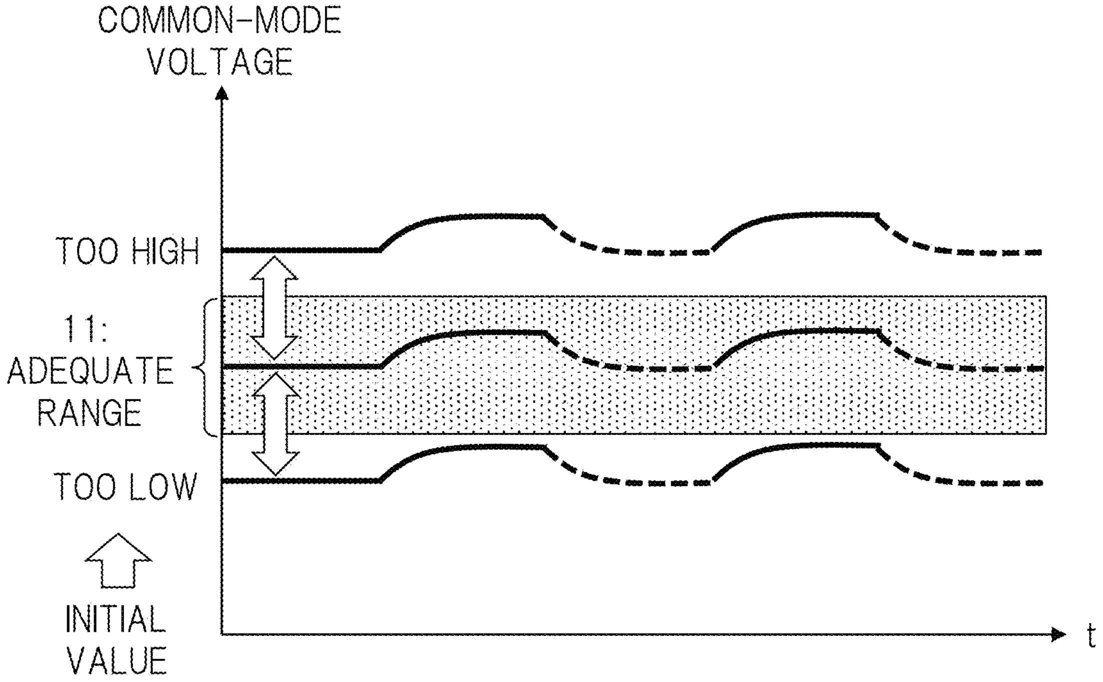
FIG. 20A is a diagram for explaining influence of an initial value of the common-mode voltage in assumption of the system of FIG. 19.
Figure 20B:
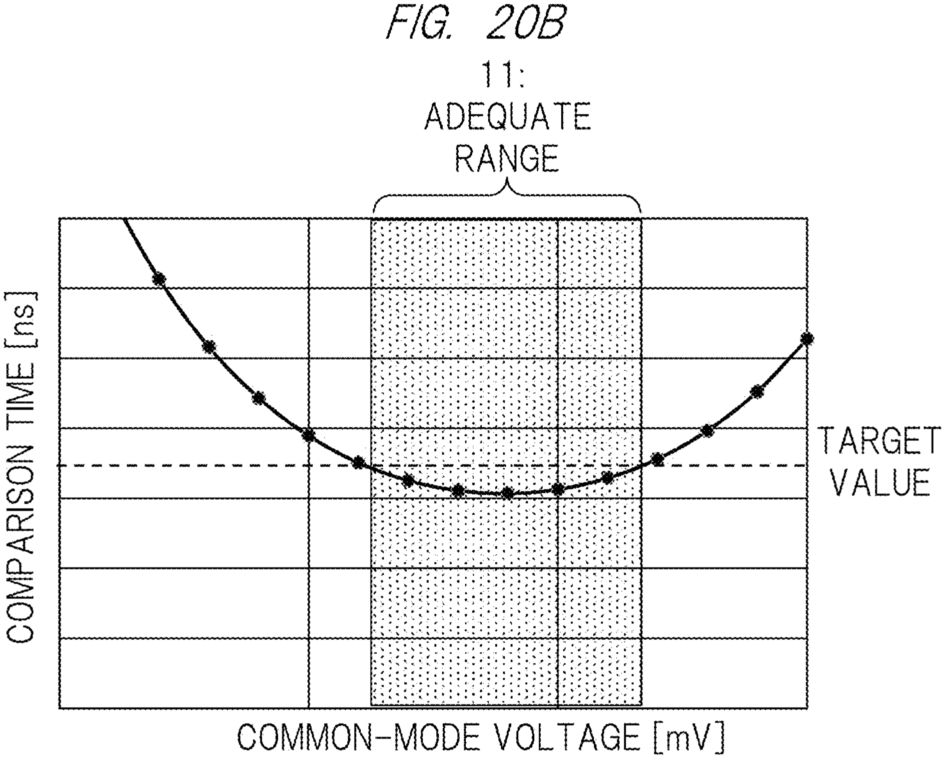
FIG. 20B is a diagram for explaining influence of an initial value of the common-mode voltage in assumption of the system of FIG. 19.

FIGS. 20A and 20B are diagrams for explaining influence of the initial value of the common-mode voltage in assumption of the system of FIG. 19. The initial value of the common-mode voltage has an adequate range 11 as illustrated in FIG. 20A. That is, as illustrated in FIG. 20B, in the assumption of the system of FIG. 19, a common-mode voltage with the shortest comparison time is present. The adequate range 11 is a range which centers the common-mode voltage with the shortest comparison time, and in which the comparison time is at a target value or less. Additionally, the adequate range 11 is a range around the intersection point between the two properties 10*n* and 10*p* in FIG. 16.

Figure 21:
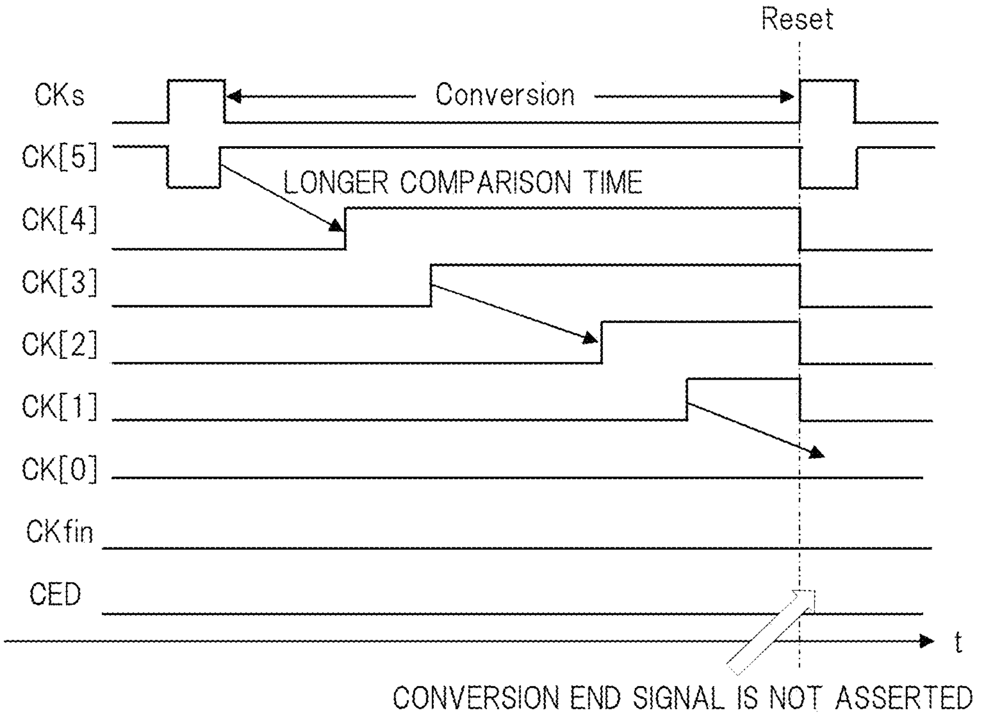
FIG. 21 is a timing chart illustrating an exemplary operation of the voltage quantizer circuit in a case of an inadequate common-mode voltage in FIGS. 20A and 20B.

FIG. 21 is a timing chart illustrating an exemplary operation of the voltage quantizer circuit in a case in which the common-mode voltage is inadequate in FIGS. 20A and 20B. As different from FIG. 4, in the example of FIG. 21, the clock signal CK[0] of the last comparator CMP[0] is not asserted by the increase in the comparison time. Accordingly, the conversion end signal CED is not asserted, either. That is, the conversion operation of the analog-digital converter ADC is not completed within the period of the sampling clock signal CKs.

As described above, even when the variation in the common-mode voltage of the differential input voltages is suppressed, if the initial value of the common-mode voltage is inadequate, there is a risk that is failure to sufficiently increase the speed of the analog-digital converter ADC. If only either one of two types of the comparators CMPp and CMPn is used, the adequate common-mode voltage can be easily made. That is, the common-mode voltage is to be low when only the p-channel comparators CMPp is used, and to be high when only the n-channel comparators CMPn is used.

However, when both the two types of the comparators CMPp and CMPn are used as illustrated in FIG. 19, the adequate common-mode voltage cannot be easily made.

One of the causes for this is that the adequate range 11 of the common-mode voltage is narrow. Another one is that the common-mode voltage is basically defined by an external circuit of the analog-digital converter ADC such as the filter unit FLTU in the example of FIG. 1. In this case, the external circuit of the analog-digital converter ADC needs to be regulated in order to make the adequate common-mode voltage in the analog-digital converter ADC. As a result, the design of the semiconductor device can be complicated. Thus, use of the following system according to the embodiment is advantageous.

<Schematic Configuration of Analog-Digital Conversion Unit>

Figure 6:
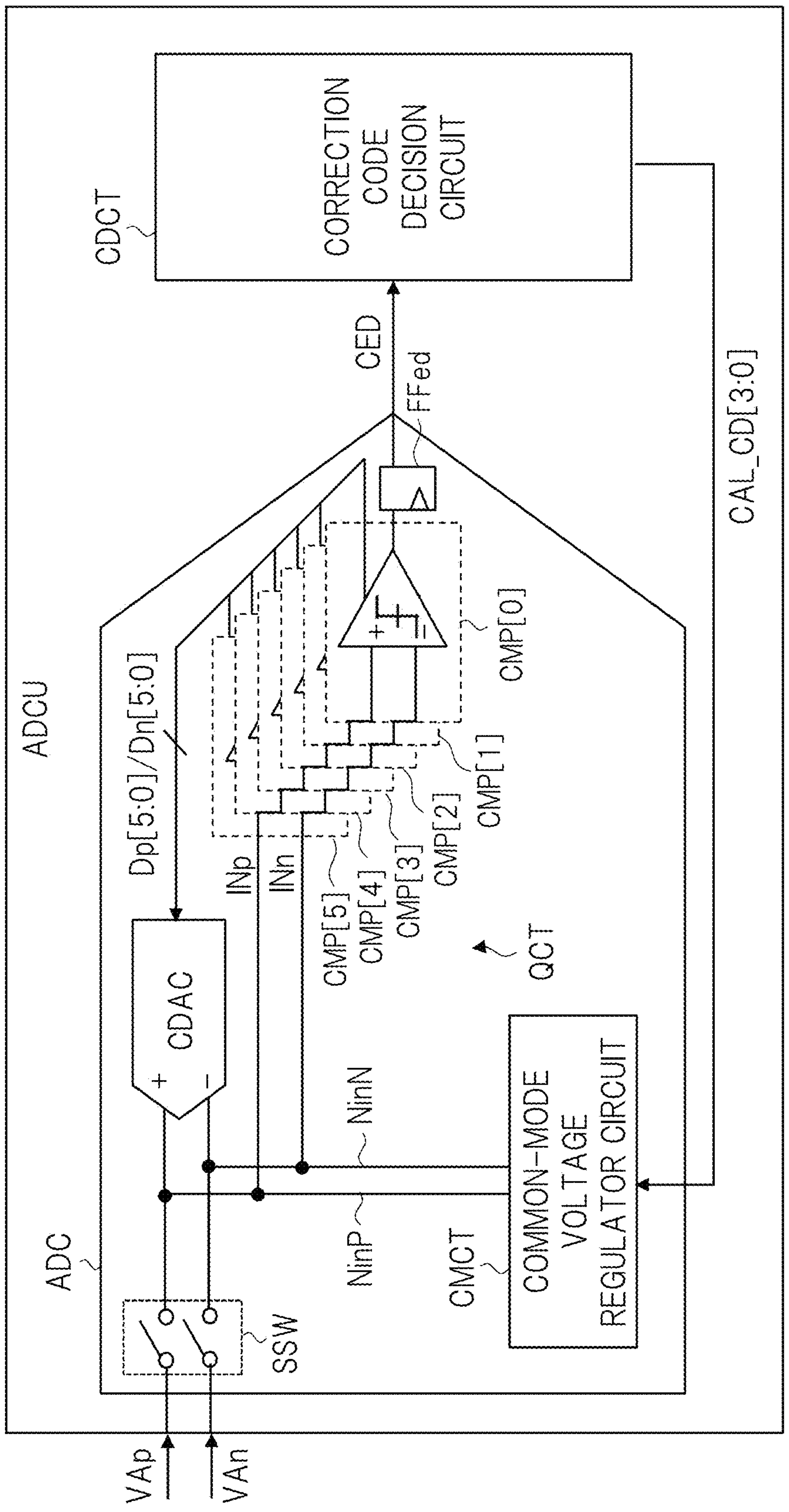
FIG. 6 is a circuit block diagram illustrating an exemplary schematic configuration of an analog-digital conversion unit of FIG. 1.

FIG. 6 is a circuit block diagram illustrating an exemplary schematic configuration of the analog-digital conversion unit of FIG. 1. The analog-digital conversion unit ADCU of FIG. 6 includes an analog-digital converter ADC and a correction code decision circuit CDCT. The analog-digital converter ADC includes a common-mode voltage regulator circuit CMCT in addition to the voltage quantizer circuit QCT illustrated in FIGS. 2A and 3.

The voltage quantizer circuit QCT converts the differential input voltages INp and INn to m-bit digital signals such as 6-bit digital signals Dp[5:0] and Dn[5:0] for every sampling period based on the sampling clock signal CKs. Then, the voltage quantizer circuit QCT asserts the conversion end signal CED when completing the conversion operation.

The correction code decision circuit CDCT is connected to the voltage quantizer circuit QCT, and receives the conversion end signal CED as its input from the voltage quantizer circuit QCT. Note that the term "connection" described in the specification means not only physical connection but also electric connection. On the basis of the conversion end signal CED, the correction code decision circuit CDCT decides a plurality of bits for correcting the common-mode voltage of the differential input voltages INp and INn, such as a 4-bit correction code CAL_CD[3:0] in this example.

Schematically, at this time, when detecting a sampling period in which the conversion end signal CED is not asserted, in other words, a sampling period in which the conversion operation is uncompleted, the correction code decision circuit CDCT changes the correction code CAL_CD[3:0]. Then, the correction code decision circuit CDCT successively changes the correction code CAL_CD [3:0] until the sampling period in which the conversion end signal CED is not asserted is not detected.

The common-mode voltage regulator circuit CMCT is connected to the correction code decision circuit CDCT and the voltage quantizer circuit QCT. The common-mode voltage regulator circuit CMCT regulates the common-mode voltage by adding or subtracting a corrected voltage based on the correction code CAL_CD[3:0] to or from the differential input voltages INp and INn.

<Details of Common-Mode Voltage Regulator Circuit>

Figure 7:
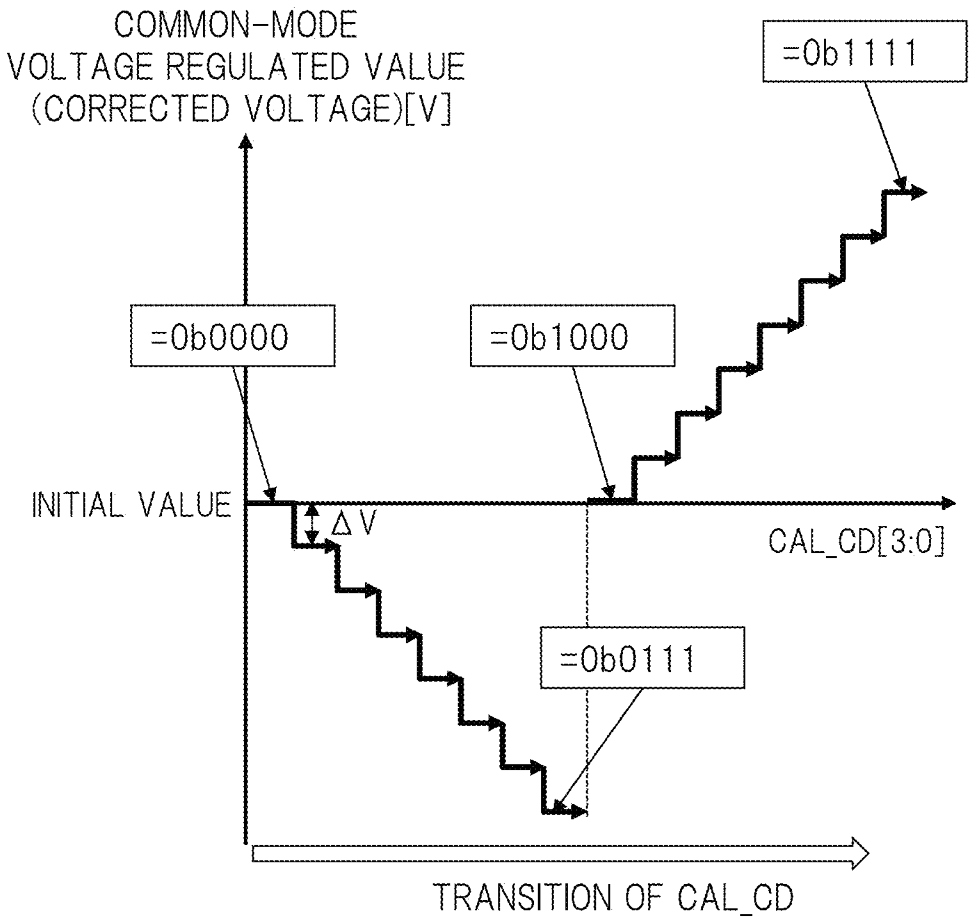
FIG. 7 is a diagram for explaining an exemplary operation of a common-mode voltage regulator circuit of FIG. 6.

FIG. 7 is a diagram for explaining an exemplary operation of the common-mode voltage regulator circuit of FIG. 6. As illustrated in FIG. 7, for example, the common-mode voltage regulator circuit CMCT adds or subtracts a corrected voltage, which is "M" ("M" is an integer from 1 to 7) times larger than a unit voltage ΔV, to or from the differential input voltages INp and Inn, on the basis of the value of the correction code CAL_CD[3:0]. In this example, whether to add or subtract the corrected voltage is defined by "1"/"0" of the correction code CAL_CD[3:0]. A magnitude "M×ΔV" of the corrected voltage is defined on the basis of a value of a correction code CAL_CD[2:0]. For example, "M=1" is defined at "CAL_CD[2:0]=001," and "M=7" is defined at "CAL_CD[2:0]=111."

Figure 8A:
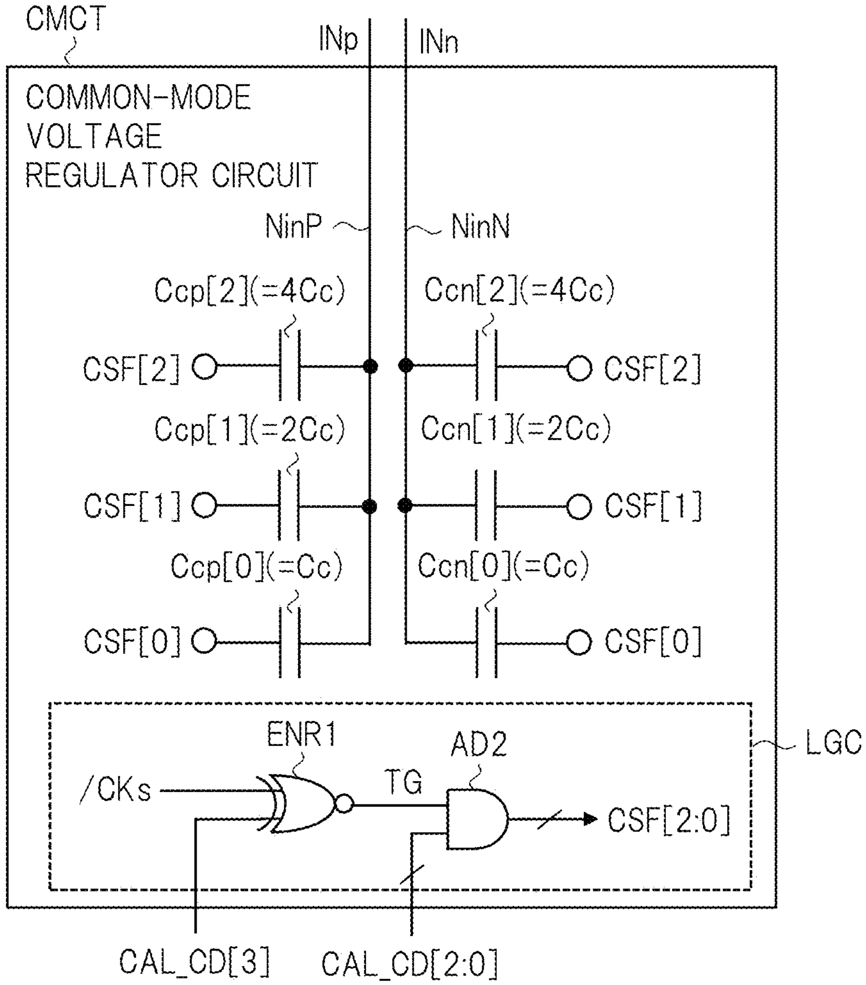
FIG. 8A is a circuit diagram illustrating an exemplary configuration of the common-mode voltage regulator circuit of FIG. 6.
Figure 8B:
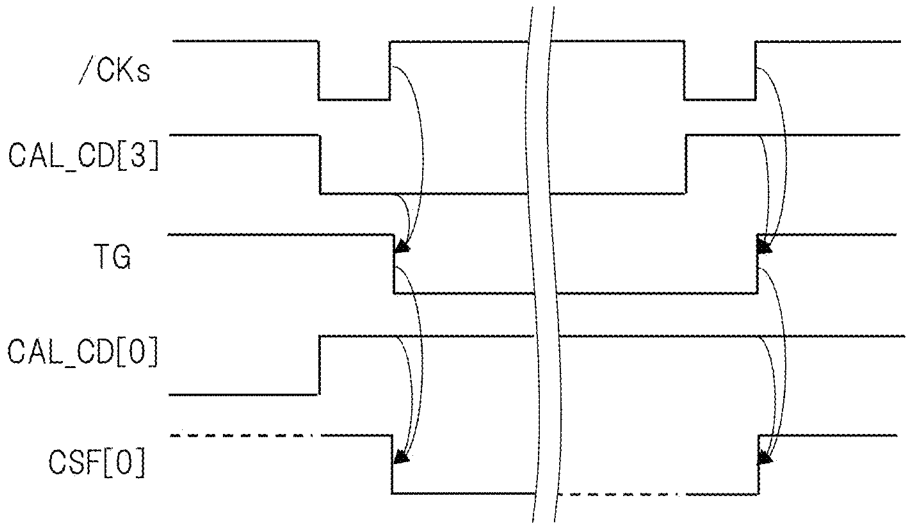
FIG. 8B is a timing chart illustrating an exemplary schematic operation of control logic of FIG. 8A.

FIG. 8A is a circuit diagram illustrating an exemplary configuration of the common-mode voltage regulator circuit of FIG. 6. FIG. 8B is a timing chart illustrating an exemplary schematic operation of control logic of FIG. 8A. The common-mode voltage regulator circuit CMCT of FIG. 8A includes a plurality of capacitors Ccp[0] to Ccp[2] and Ccn[0] to Ccn[2] serving as correction capacitors and connected to the differential input nodes NinP and NinN. The common-mode voltage regulator circuit CMCT also includes control logic LGC for controlling these correction capacitors.

As similar to the digital-analog converter CDAC, the common-mode voltage regulator circuit CMCT schematically redistributes the charges of the differential input nodes NinP and NinN by use of a correction capacitor decided based on the correction code CAL_CD[2:0] from among the plurality of correction capacitors. As a result, the common-mode voltage regulator circuit CMCT regulates the common-mode voltage of the differential input voltages INp and INn. Note that the common-mode voltage regulator circuit may be not of the capacitor type but of, for example, the resistor type. However, the capacitor type is desirably used in terms of the consumed power and the like.

One ends of the positive-side capacitors Ccp[0] to Ccp[2] are connected to the positive-side differential input node NinP. Comon shift signals CSF[0] to CSF[2] are applied to the other ends of the capacitors Ccp[0] to Ccp[2], respectively. Similarly, one ends of the negative-side capacitors Ccn[0] to Ccn[2] are connected to the negative-side differential input node NinN. The common shift signals CSF[0] to CSF[2] are applied also to the other ends of the capacitors Ccn[0] to Ccn[2], respectively.

The capacitance values of the capacitors Ccp[0] to Ccp[2] are different by, for example, $2^k$. That is, both the capacitors Ccp[0] and Ccn[0] have a capacitance value of "Cc." In this case, both the capacitors Ccp[1] and Ccn[1] have a capacitance value of "2×Cc" and both the capacitors Ccp[2] and Ccn[2] have a capacitance value of "4×Cc."

The control logic LGC includes, for example, an exclusive NOR gate ENR1 and an AND gate AD2. The exclusive NOR gate ENR1 receives an inverted sampling clock signal (/CKs) and a correction code CAL_CD[3] for defining a sign of the corrected voltage as its inputs, and outputs a trigger signal TG. The AND gate AD2 receives the correction code CAL_CD[2:0] and the trigger signal TG as its inputs, and outputs the common shift signals CSF[0] to CSF[2]. That is, the number of the AND gates AD2 is specifically as many as that for three bits.

As illustrated in FIG. 8B, when the correction code CAL_CD[3] is "0", the exclusive NOR gate ENR1 outputs a fall trigger signal TG in response to a rise of the inverted sampling clock signal (/CKs), in other words, a fall of the sampling clock signal CKs. When the correction code CAL_CD[0] is "1", the AND gate AD2 shifts the common shift signal CSF[0] from the level "H" to the level "L" in response to a fall of the trigger signal TG. Consequently, charges of the capacitors Ccp[0] and Ccn[0] are redistributed, and the unit voltage "ΔV" as illustrated in FIG. 7 is subtracted from the common-mode voltage, in other words, from both the differential input voltages INp and INn.

To the contrary, when the correction code CAL_CD[3] is "1", the exclusive NOR gate ENR1 outputs a rise trigger signal TG in response to a rise of the inverted sampling clock signal (/CKs). When the correction code CAL_CD[0] is "1", the AND gate AD2 shifts the common shift signal CSF[0] from the level "L" to the level "H" in response to a rise of the trigger signal TG. Consequently, charges of the capacitors Ccp[0] and Ccn[0] are redistributed, and the unit voltage "ΔV" is added to the common-mode voltage. Similarly, for example, when two common shift signals CSF[0] and CSF [1] are shifted to the level "H", the "(1+2)×ΔV" is added to the common-mode voltage.

<Details of Correction Code Decision Circuit>

Figure 9A:
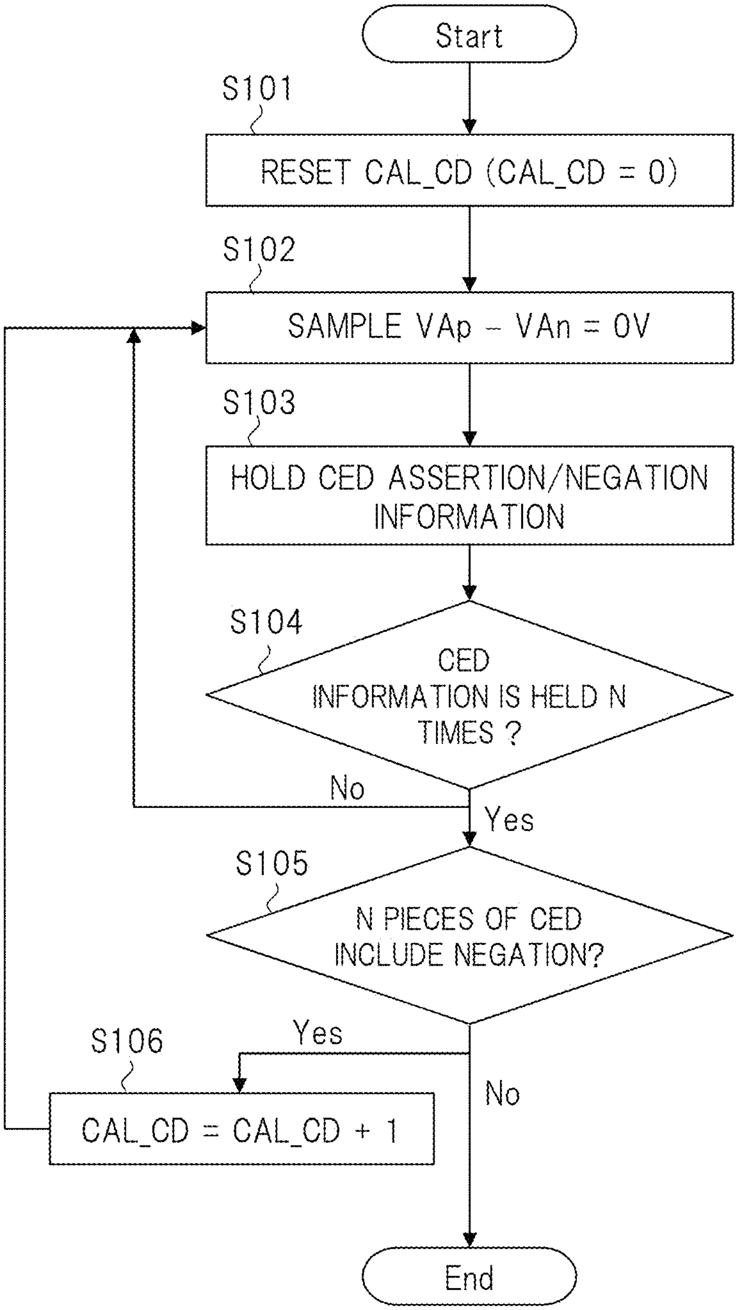
FIG. 9A is a flowchart illustrating an exemplary processing content of a correction code decision circuit of FIG. 6.
Figure 9B:
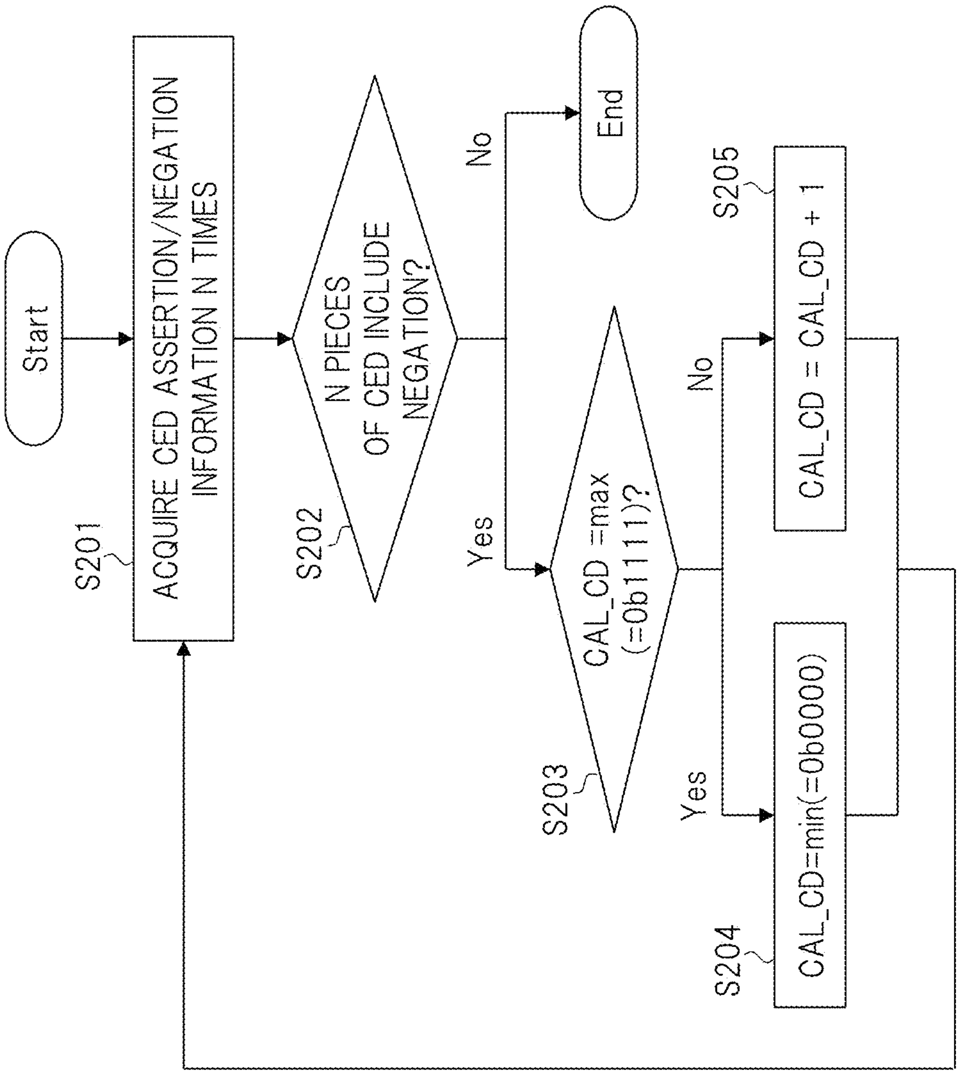
FIG. 9B is a flowchart illustrating an exemplary processing content different from those of FIG. 9A.

FIG. 9A is a flowchart illustrating an exemplary processing content of the correction code decision circuit of FIG. 6. FIG. 9B is a flowchart illustrating an exemplary processing content different from that of FIG. 9A. The correction code decision circuit CDCT is achieved by, for example, a sequencer circuit or the like configured to perform the processings illustrated in FIG. 9A or 9B. The flow of FIG. 9A is performed on the foreground in a correction period included in a period in which the voltage quantizer circuit QCT does not perform the normal operation. The correction period is included in, for example, an initial period of the voltage quantizer circuit QCT resulted from the start up of the semiconductor device DEV, a standby period of the voltage quantizer circuit QCT, or the like.

In FIG. 9A, first, the correction code decision circuit CDCT resets the correction code CAL_CD[3:0] to zero (step S101). Subsequently, the correction code decision circuit CDCT causes the voltage quantizer circuit QCT to sample the initial values such as "VAp−VAn=0V" of the external analog input voltages VAp and VAn to perform the conversion operation (step S102). The correction code decision circuit CDCT then holds information as to whether the conversion end signal CED output from the voltage quantizer circuit QCT has been asserted or remained negated, in other words, information as to whether the conversion end signal CED is at the level "H" or the level "L" (step S103).

Next, the correction code decision circuit CDCT determines whether the information of the conversion end signal CED has been held preset "N" times ("N" is to be an integer of 2 or more) (step S104). When the number of times is less than N (step S104: No), the correction code decision circuit CDCT returns the processings to step S102, and repeatedly performs the processings in steps S102 and S103. To the contrary, when the number of times reaches N (step S104: Yes), the correction code decision circuit CDCT determines whether N pieces of the information of the conversion end signal CED includes one or more negation levels (step S105).

When the information includes no negation level (step S105: No), the correction code decision circuit CDCT fixes a current value as the value of the correction code CAL_CD [3:0]. To the contrary, when the information includes any negation level (step S105: Yes), the correction code decision circuit CDCT increments the correction code CAL_CD[3:0] (by +1) (step S106). Then, the correction code decision circuit CDCT returns the processings to step S102 to acquire the information of the conversion end signal CED N times again while reflecting the incremented correction code CAL_CD[3:0] on the common-mode voltage regulator circuit CMCT.

The value of the correction code CAL_CD[3:0], which has been fixed in the case of "No" in step S105, is applied in the subsequent normal operations. Specifically, as can be seen from FIG. 8B, for example, the common-mode voltage of the differential input voltages INp and INn is regulated immediately after the external analog input voltages VAp and VAn are sampled in the differential input nodes NinP and NinN in response to the sampling clock signal CKs.

To the contrary, the flow of FIG. 9B is operated on the background in a period in which the voltage quantizer circuit QCT performs the normal operation. In FIG. 9B, first, the correction code decision circuit CDCT acquires the information as to whether the conversion end signal CED output from the voltage quantizer circuit QCT has been asserted or remains negated N times to be preset (N is to be an integer of 2 or more) (step S201). In other words, for each of the sampling periods for N times, the correction code decision circuit CDCT confirms whether the conversion end signal CED has been asserted.

Subsequently, the correction code decision circuit CDCT determines whether one or more negation level is included in the N pieces of the information of the conversion end signal CED (step S202). When no negation level is included (step S202: No), the correction code decision circuit CDCT keeps the current value as the value of the correction code CAL_CD[3:0], and terminates the processing. In this case, the flow of FIG. 9B is performed again as needed.

To the contrary, when any negation level is included (step S202: Yes), the correction code decision circuit CDCT determines whether the correction code CAL_CD[3:0] has reached the maximum value such as "1111" (step S203). When the maximum value has been reached (step S203: Yes), the correction code decision circuit CDCT returns the value of the correction code CAL_CD[3:0] to the minimum value such as "0000", and proceeds to the processing in step S201 (step S204).

When the maximum value has not been reached in step S203 (No), the correction code decision circuit CDCT increments the correction code CAL_CD[3:0] (by +1) (step S205). Then, the correction code decision circuit CDCT returns to step S201 to acquire the information of the conversion end signa CED N times again while reflecting the incremented correction code CAL_CD[3:0] on the common-mode voltage regulator circuit CMCT.

Figure 10A:
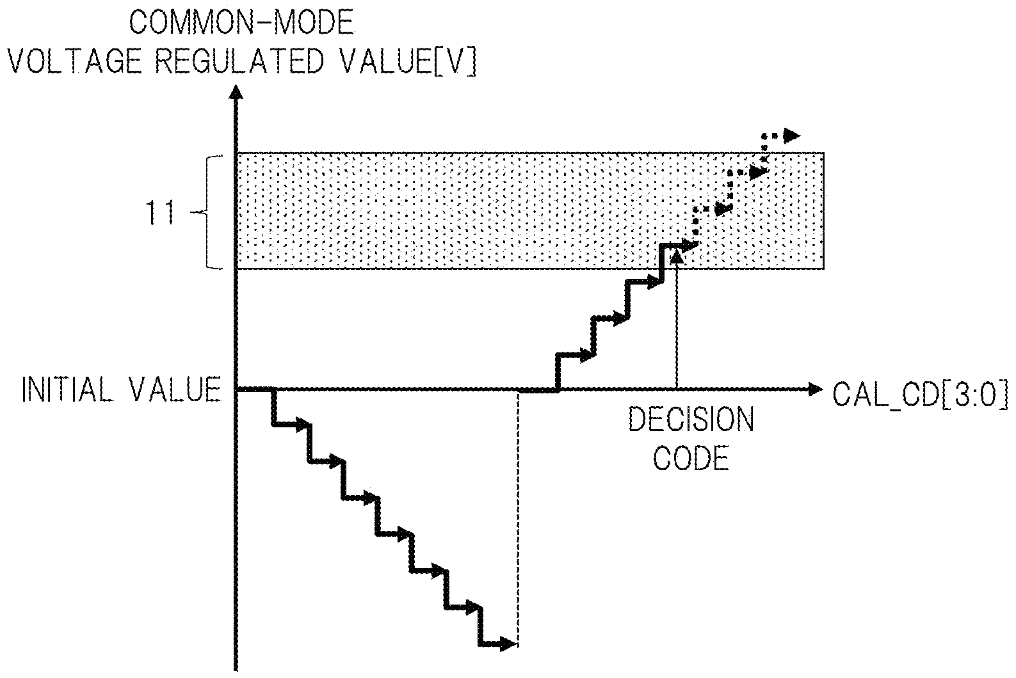
FIG. 10A is a diagram illustrating an exemplary result of correction code decision under use of the flowchart of FIG. 9A or 9B.
Figure 10B:
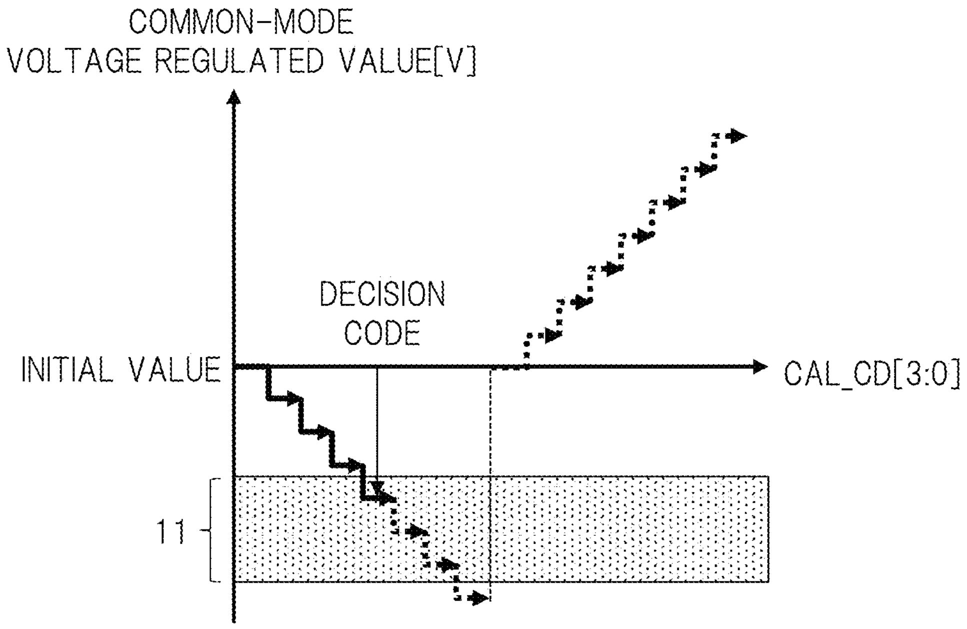
FIG. 10B is a diagram illustrating an exemplary result different from that of FIG. 10A.

FIGS. 10A and 10B are diagrams each illustrating an exemplary determined result of the correction code under use of the flow of FIG. 9A or 9B. As similar to the case of FIG. 7, FIGS. 10A and 10B illustrate an exemplary relationship between the value of the correction code CAL_CD [3:0] and the common-mode voltage regulated value that is a corrected voltage. As illustrated in FIG. 20A and others, the common-mode voltage, and eventually the common-mode voltage regulated value, have the adequate range 11. The adequate range 11 is present on the positive side with reference to the initial value of the common-mode voltage in FIG. 10A and on the negative side in FIG. 10B.

When the common-mode voltage is present within the adequate range 11, the conversion end signal CED is always asserted for each sampling period. To the contrary, when the common-mode voltage is not present within the adequate range 11, the conversion end signal CED may not be asserted for each sampling period. When the correction code CAL_CD[3:0] is successively changed until the conversion end signal CED is always asserted, once the common-mode voltage regulated value is present within the adequate range 11, the value of the correction code CAL_CD[3:0] is decided as illustrated in FIG. 10A or 10B.

As described above, by use of the flows of FIGS. 9A and 9B, the common-mode voltage can be regulated to be within the adequate range 11 even on the foreground and the background. Consequently, the comparison time of the comparators CMP[5] to CMP[0] can be reduced, and the speed of the voltage quantizer circuit QCT, and eventually the analog-digital converter ADC, can be increased. Particularly, the common-mode voltage is regulated on the background, and therefore, regulation can be performed in real time in response to even change of an operational condition such as voltage or temperature during the normal operation.

Since this is the system of monitoring the conversion speed of the analog-digital converter ADC by use of the conversion end signal CED and regulating the common-mode voltage on the basis of the monitoring result, there is no need to additionally provide, for example, a common-mode voltage detector circuit and the like, and overhead of the circuit area or the like can be suppressed. Further, the common-mode voltage can be regulated in the analog-digital conversion unit ADCU, and thus, limitation of the common-mode voltage in the external circuits configured to output the analog input voltages VAp and VAn can be moderated. Consequently, the design of the semiconductor device DEV including the external circuits can be facilitated, and versality of the analog-digital converter ADC can be enhanced.

Note that the flow of FIG. 9A or 9B is not limited to the illustrated examples, and may be modified as needed. For example, the flow of FIG. 9A may be modified such that, for example, an intermediate value is assumed as the decision code, the intermediate value being among the respective values of the correction code CAL_CD[3:0] corresponding to the upper limit and the lower limit of the adequate range 11 illustrated in FIG. 10A and acquired based on the conversion end signal CED. Alternatively, the flow of FIG. 9A may be modified to be, for example, a flow using binary search.

<Details of Group of Comparators>

Figure 11A:
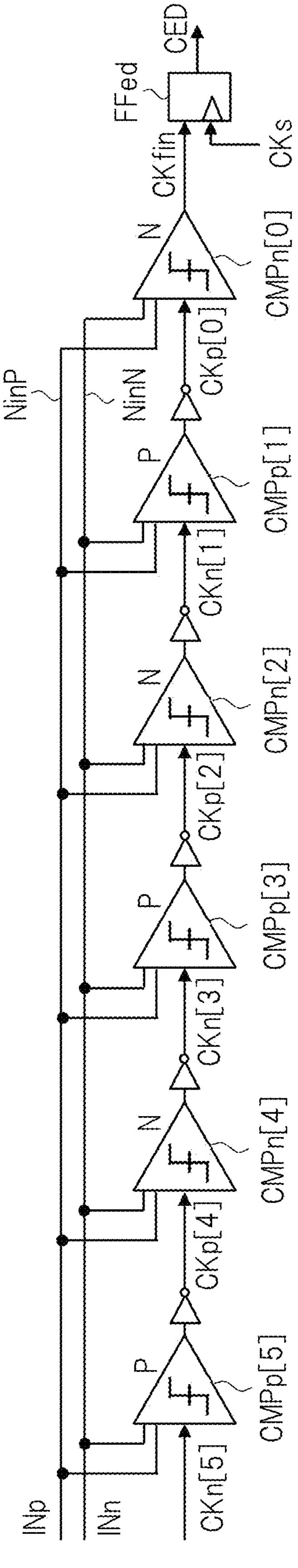
FIG. 11A is a circuit diagram illustrating an exemplary configuration of a group of comparators of FIG. 6.

FIG. 11A is a circuit diagram illustrating an exemplary configuration of a group of comparators of FIG. 6. In FIG. 11A, the p-channel comparators and the n-channel comparators are alternately connected as similar to FIG. 19. In this example, the comparators CMP[5], CMP[3], and CMP[1] illustrated in FIG. 6 are made of the p-channel comparators CMPp[5], CMPp[3], and CMPp[1] illustrated in FIG. 5B, respectively. To the contrary, the comparators CMP[4], CMP[2], and CMP[0] illustrated in FIG. 6 are made of the n-channel comparators CMPn[4], CMPn[2], and CMPn[0] illustrated in FIG. 5A, respectively.

Figure 11B:
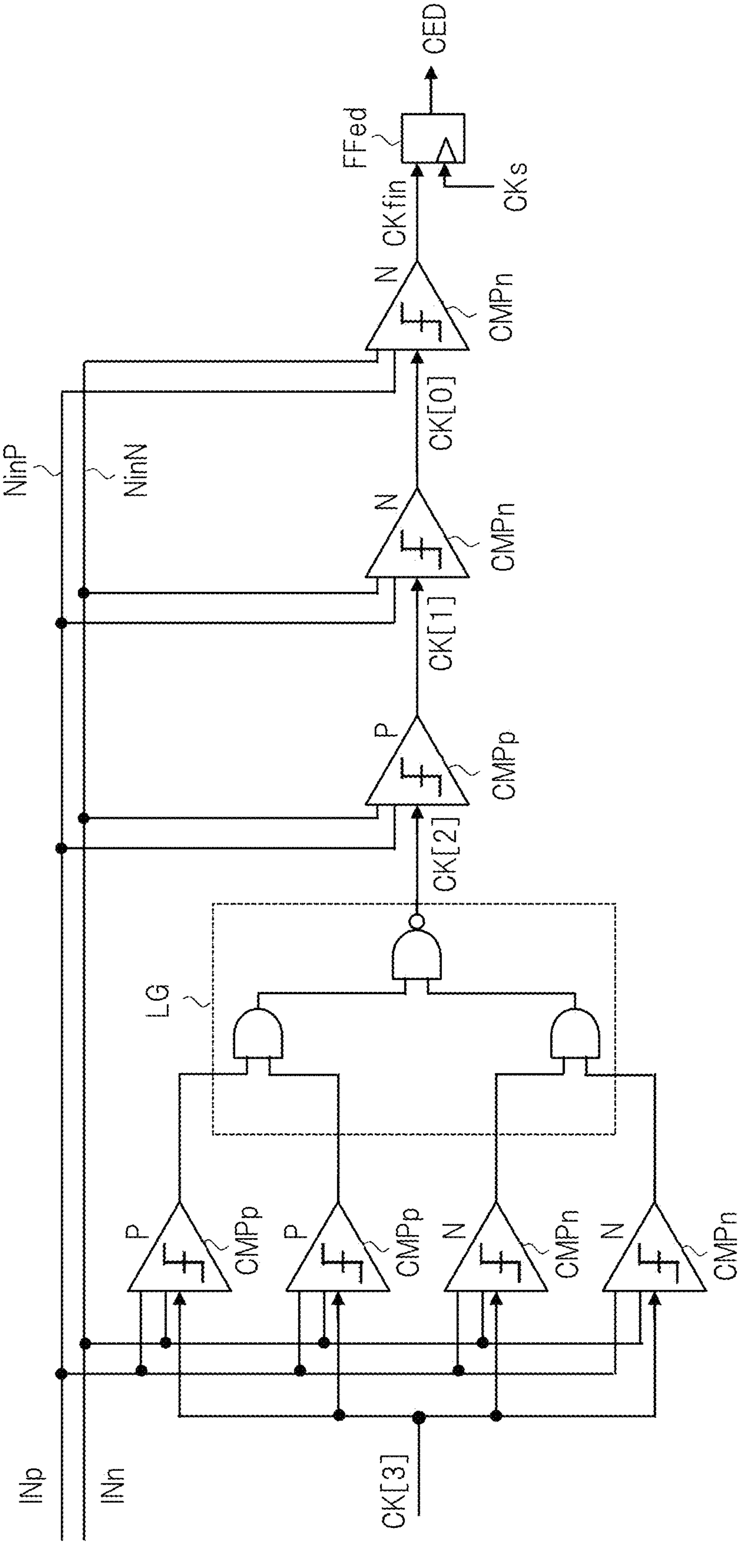
FIG. 11B is a circuit diagram for explaining various modification examples of FIG. 11A.

FIG. 11B is a circuit diagram for explaining various modification examples of FIG. 11A. As illustrated in FIG. 11B, the group of comparators may be configured such that the p-channel comparators CMPp and the n-channel comparator CMPn, which are connected in parallel to the differential input nodes NinP and NinN, perform the predetermined output via the logical gate LG. Alternatively, the p-channel comparators CMPp and the n-channel comparators CMPn are not always alternately connected, and only the comparators of one type may be successively connected. Actually, the number of p-channel comparators CMPp and the number of n-channel comparators CMPn, which configure the group of comparators, are defined to be equal to some extent.

<Operation Timing of Correction Code Decision Circuit>

Figure 12A:
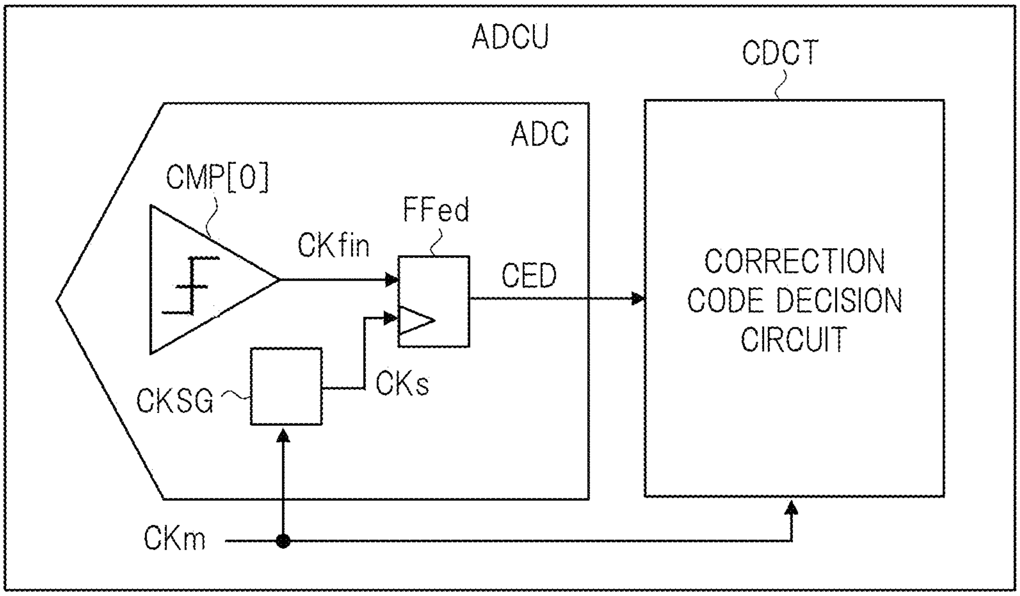
FIG. 12A is a diagram illustrating a method of generating a sampling clock signal in FIG. 6 and an exemplary operation timing of the correction code decision circuit based on the method.
Figure 12B:
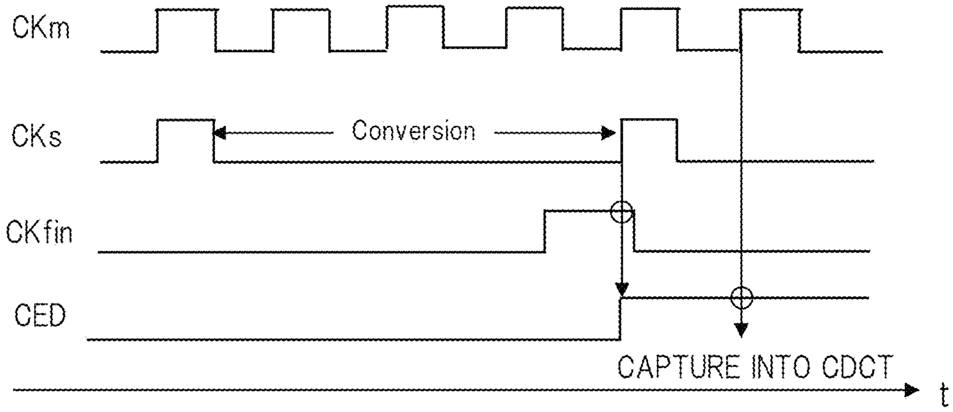
FIG. 12B is a diagram illustrating a method of generating a sampling clock signal in FIG. 6 and an exemplary operation timing of the correction code decision circuit based on the method.

FIGS. 12A and 12B are diagrams each illustrating a method of generating the sampling clock signal in FIG. 6 and an exemplary operation timing of the correction code decision circuit in the method. In FIG. 12A, a sampling clock generator circuit CKSG is provided in the analog-digital converter ADC. The sampling clock generator circuit CKSG receives a master clock signal CKm as its input output from the outside, and generates a sampling clock signal CKs of 1 GHz, 2 GHz or the like by, for example, thinning out the sampling clock generator circuit CKSG as illustrated in FIG. 12B.

At a rise edge of the sampling clock signal CKs, the flip-flop circuit FFed latches the clock signal CKfin output from the comparator CMP[0], and outputs the conversion end signal CED. To the contrary, at the rise edge of the sampling clock signal CKs, the clock signal CKfin of the assertion level is negated. The flip-flop circuit FFed can latch and hold the clock signal CKfin of the assertion level as the conversion end signal CED before the negation.

The correction code decision circuit CDCT receives the conversion end signal CED which is held as described above, as its input. To the correction code decision circuit CDCT, the master clock signal CKm is supplied as illustrated in FIG. 12A. As a result, as illustrated in FIG. 12B, the correction code decision circuit CDCT can capture the conversion end signal CED at, for example, a rise edge of the master clock signal CKm caused immediately after the sampling clock signal CKs. Consequently, at the early stage, the correction code decision circuit CDCT can reflect the information of the conversion end signal CED to decide the value of the correction code CAL_CD[3:0].

Principal Effects of First Embodiment

As described above, by use of the system according to the first embodiment, the correction code CAL_CD[3:0] can be decided under use of the conversion end signal CED, and the common-mode voltage of the differential input voltages INp and INn can be regulated based on the decided correction code on the foreground or the background. Consequently, typically, the comparison time of each comparator can be reduced, and the speed of the analog-digital converter ADC can be increased. Particularly, even the change in the operational condition such as voltage or temperature can be immediately handled by the regulation on the background, and the high-speed operations of the analog-digital converter ADC can be maintained.

Second Embodiment

<Schematic Configuration of Analog-Digital Conversion Unit>

Figure 13:
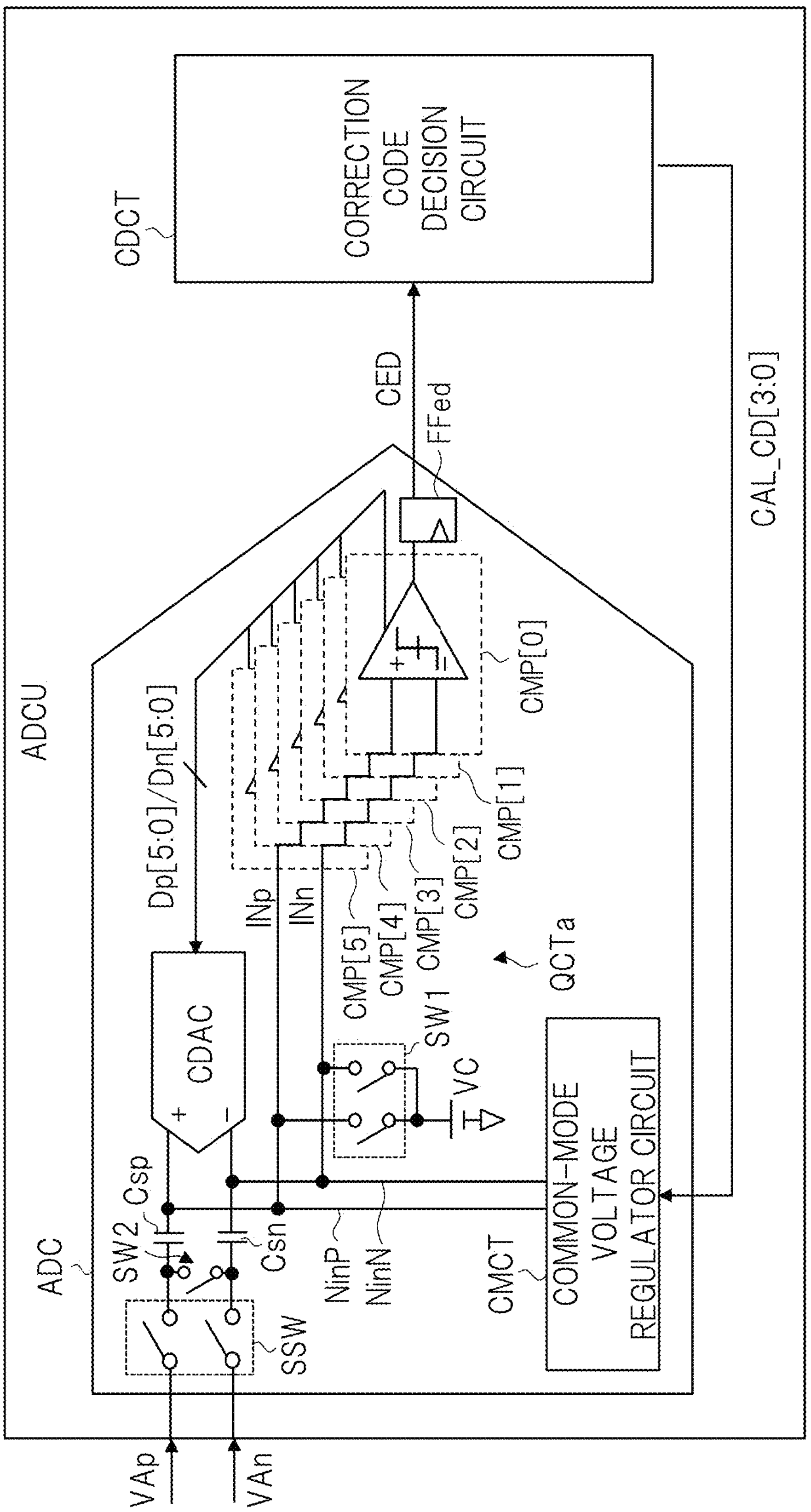
FIG. 13 is a circuit block diagram illustrating an exemplary schematic configuration of an analog-digital conversion unit of FIG. 1 in a semiconductor device according to a second embodiment.

FIG. 13 is a circuit block diagram illustrating an exemplary schematic configuration of the analog-digital conversion unit of FIG. 1 in a semiconductor device according to a second embodiment. The analog-digital conversion unit ADCU of FIG. 13 is different from that in the exemplary configuration of FIG. 6 in that capacitors Csp and Csn which are the sampling capacitors and switches SW1 and SW2 are added in a voltage quantizer circuit QCTa.

One of the two electrodes of the capacitor Csp is connected to the sampling switch SSW while the other of the two electrodes is connected to the positive-side differential input node NinP. Similarly, one of the two electrodes of the capacitor Csn is connected to the sampling switch SSW while the other of the two electrodes is connected to the negative-side differential input node NinN. The switch SW1 is connected to the differential input nodes NinP and NinN, and applies a predetermined power voltage VC to the differential input nodes NinP and NinN when being turned ON. The switch SW2 makes short-circuit between the electrodes of the two capacitors Csp and Csn, the electrodes being closer to the sampling switch SSW, when being turned ON.

The sampling switch SSW and the switch SW1 are controlled to be turned ON in the sampling period. Consequently, the analog input voltages VAp and VAn are sampled in the capacitors Csp and Csn, respectively. In the comparison period after the period, the sampling switch SSW and the switch SW1 are controlled to be turned OFF, and the switch SW2 is instead controlled to be turned ON. Consequently, the charges of the capacitors Csp and Csn are redistributed in the capacitors in the digital-analog converter CDAC.

As described in the first embodiment, the predetermined voltage "Vref" of the digital-analog converter CDAC is regulated by the capacitance values of the dummy capacitors CpD and CnD of FIG. 2B. Specifically, the larger the capacitance values of the dummy capacitors CpD and CnD is, the smaller the predetermined voltage "Vref" is. When the predetermined voltage "Vref" is small, a dynamic range of the analog-digital converter ADC is narrowed, and the system may not be applicable to, for example, the analog input voltages VAp and VAn with large differential amplitudes.

Further, in the system according to the second embodiment, as illustrated in FIG. 8A, the capacitors Ccp[0] to Ccp[2] and Ccn[0] to Ccn[2] in the common-mode voltage regulator circuit CMCT are connected to the differential input nodes NinP and NinN. The capacitors Ccp[0] to Ccp[2] and Ccn[0] to Ccn[2] can be equivalently regarded as the other of the dummy capacitors CpD and CnD. Consequently, the predetermined voltage "Vref" can be made smaller, and the dynamic range of the analog-digital converter ADC can be made narrower.

In such a state, for example, the sampling is performed in the top plates of the capacitors in the digital-analog converter CDAC of FIG. 2B, and thus, the voltage quantizer circuit QCT of FIG. 6 is also referred to as top plate type. In the top plate type, the differential input voltages INp and INn at the early stage of the comparison period are equal to the analog input voltages VAp and VAn. Thus, the capacitance values of the capacitors Ccp[0] to Ccp[2] and Ccn[0] to Ccn[2] in the common-mode voltage regulator circuit CMCT may be limited in order to maintain the dynamic range of the analog-digital converter ADC.

To the contrary, sampling is performed in the bottom plates of the capacitors CsP and Csn, and thus, the voltage quantizer circuit QCTa of FIG. 13 is also referred to as bottom plate type. In the bottom plate type, the larger the capacitance values of the dummy capacitors CpD and CnD and the capacitors Ccp[0] to Ccp[2] and Ccn[0] to Ccn[2] in the common-mode voltage regulator circuit CMCT are, the smaller the differential input voltages INp and INn at the early stage of the comparison period are. Consequently, for example, even when the capacitance values of the capacitors Ccp[0] to Ccp[2] and Ccn[0] to Ccn[2] are large, the dynamic range of the analog-digital converter ADC can be secured.

Principal Effects of Second Embodiment

Even by use of the system according to the second embodiment, the similar effects to various effects of the first embodiment, which is typically the high speed of the analog-digital converter ADC, can be achieved. As different from the system according to the first embodiment, the limitation on the capacitance values of the capacitors Ccp[0] to Ccp[2] and Ccn[0] to Ccn[2] in the common-mode voltage regulator circuit CMCT can be moderated, and thus, the design is facilitated. Additionally, the dynamic range of the analog-digital converter ADC can be easily secured.

Third Embodiment

<Details of Group of Comparators>

Figure 14:
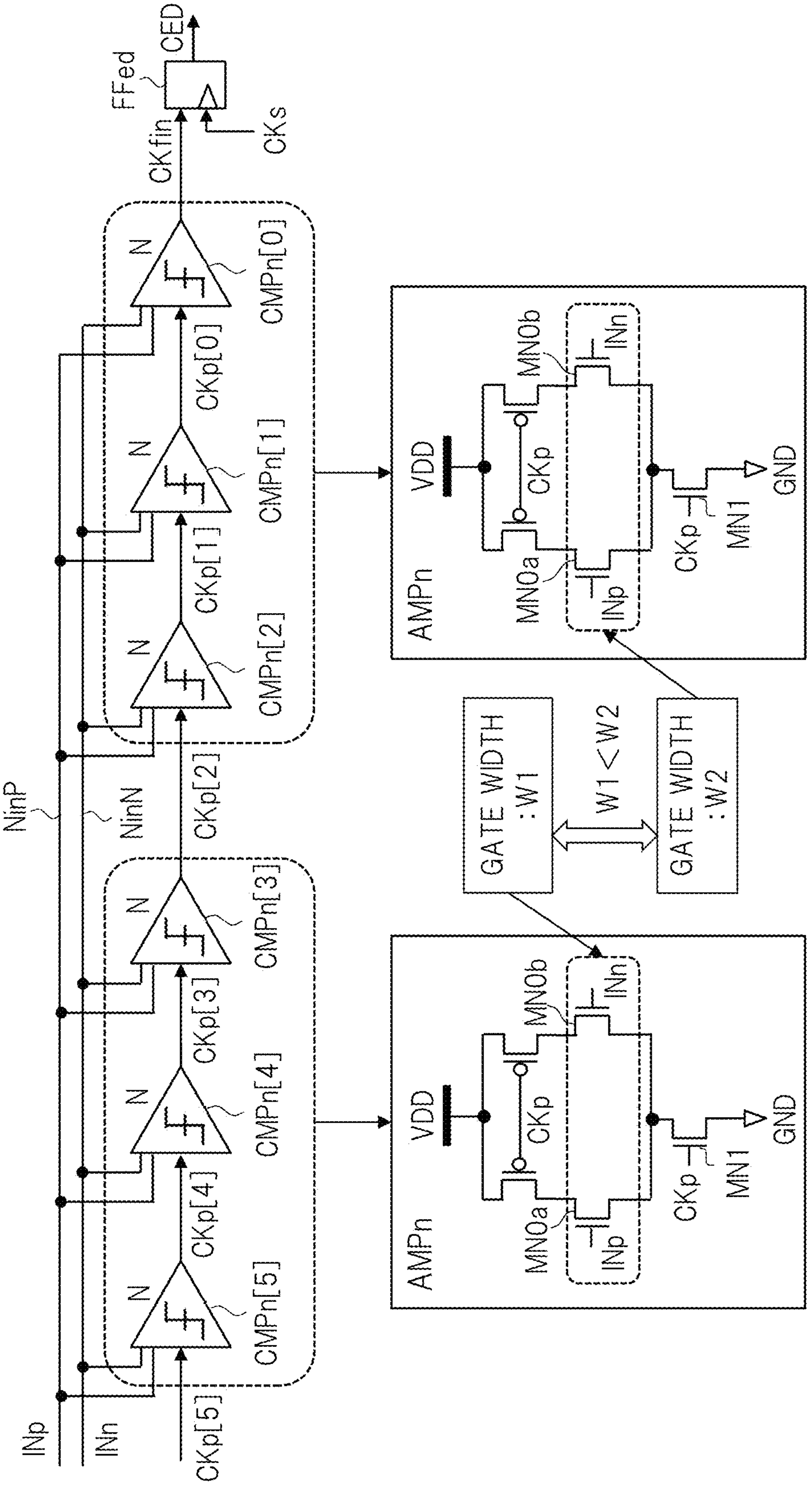
FIG. 14 is a circuit diagram illustrating an exemplary configuration of a group of comparators of FIG. 6 or 13 in a semiconductor device according to a third embodiment.

FIG. 14 is a circuit diagram illustrating an exemplary configuration of a group of comparators of FIG. 6 or 13 in a semiconductor device according to a third embodiment. As different from FIG. 11A, in FIG. 14, all the comparators CMP[0] to CMP[5] are made of n-channel comparators CMPn[0] to CMPn[5]. Additionally, in this example, the input transistors are different between the comparators CMPn[5] to CMPn[3] which decide the most significant bits of the digital signal and operate in the earlier period of the successive comparison and the comparators CMPn[2] to CMPn[0] which decide the least significant bits of the digital signal and operate in the later period of the successive comparison.

Specifically, a gate width W1 of the nMOS transistors MN0*a* and MN0*b* serving as the input transistors in the comparators CMPn[5] to CMPn[3] is designed to be smaller than a gate width W2 of the nMOS transistors MN0*a* and MN0*b* serving as input transistors in the comparators CMPn[2] to CMPn[0]. Note that all the comparators CMP[0] to CMP[5] may be made of the p-channel comparators CMPp[0] to CMPp[5] instead of the n-channel comparators. Also in this case, the relationship between the gate widths is the same as in the n-channel comparators.

Figure 15:
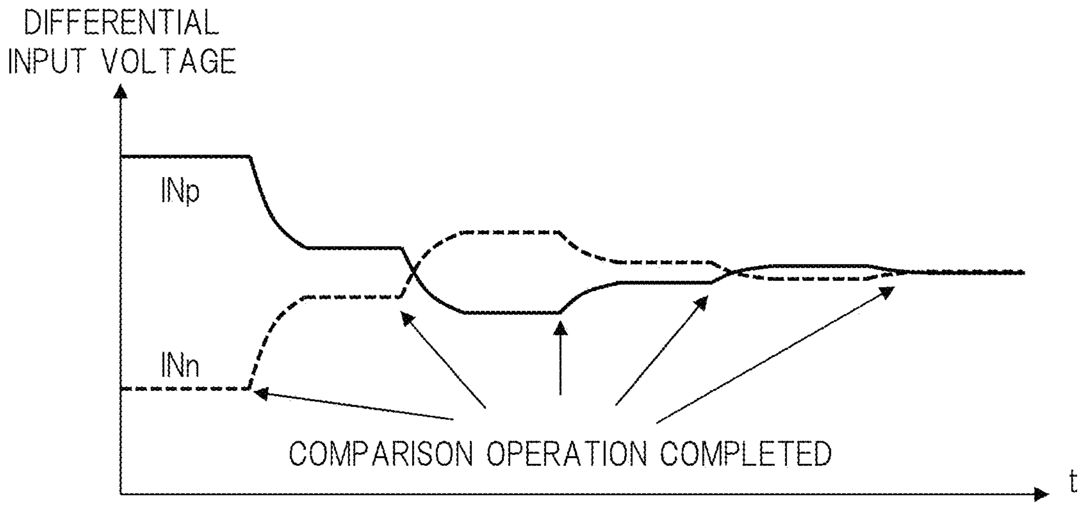
FIG. 15 is a schematic diagram illustrating an exemplary transition of differential input voltages of FIG. 6 or 13 in the semiconductor device according to the third embodiment.

FIG. 15 is a schematic diagram illustrating an exemplary transition of the differential input voltage of FIG. 6 or 13 in the semiconductor device according to the third embodiment. As illustrated in FIG. 15, the voltage difference |INp−INn| between the differential input voltages INp and INn is updated by the digital-analog converter CDAC every time the comparison operation is completed, and is gradually decreased. Thus, the increase in the speed of the comparison operation at the early stage and the increase in the accuracy of the comparison operation at the later stage, more specifically the decrease in noises, are efficient in terms of a balance between the speed and the accuracy.

Figure 16:
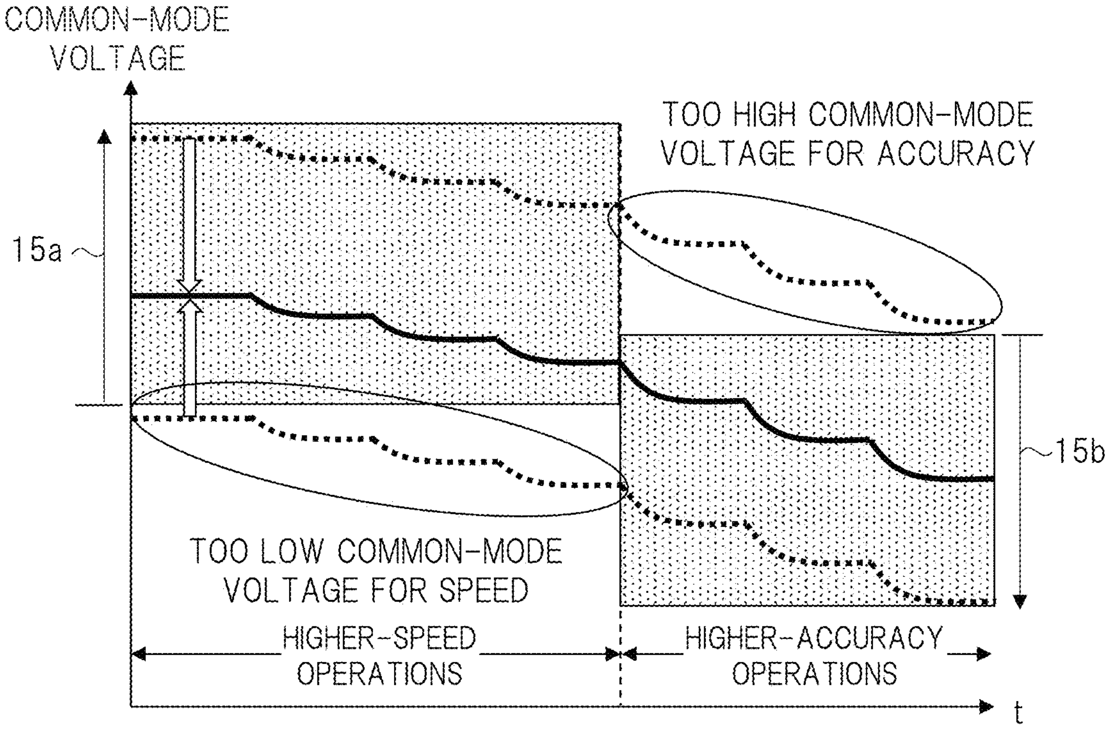
FIG. 16 is a timing chart illustrating an exemplary change of a common-mode voltage by the group of comparators of FIG. 14.

FIG. 16 is a timing chart illustrating an exemplary change in the common-mode voltage made by the group of comparators of FIG. 14. As illustrated in FIG. 16, when the n-channel comparators CMPn are used, the common-mode voltage gradually decreases every time the comparison operation is performed. As different from the first embodiment, by active use of this decrease in the common-mode voltage, both the increase in the speed and the increase in the accuracy can be achieved. That is, as illustrated in FIG. 16, an adequate range 15*a* of the common-mode voltage for the speed is present in a relatively high range, and an adequate range 15*b* thereof for the accuracy is present in a relatively low range. Thus, the high speed can be achieved in the initial comparison operations, and then, the common-mode voltage is gradually decreased to inhibit the high speed but achieve the high accuracy.

However, the common-mode voltage needs to be kept within the adequate range in order to balance the speed and the accuracy. Therefore, it is desirable to adequately define the initial value of the common-mode voltage. Specifically, it is desirable to adequately define the initial value of the common-mode voltage to have a property illustrated with a solid line in FIG. 16. That is, as can be seen from a property illustrated with a broken line in FIG. 16, the accuracy may be not sufficient if the initial vale of the common-mode voltage is too high, and the speed may be not sufficient if the initial vale of the common-mode voltage is too low.

In order to adequately define the initial value of the common-mode voltage, the correction code decision circuit CDCT and the common-mode voltage regulator circuit CMCT as similar to those of the first embodiment may be provided. As can be seen from FIG. 16, when the n-channel comparators CMPn are used, the common-mode voltage having, for example, the lower limit which can meet the adequate range 15*a* for the speed may be found. Similarly, when the p-channel comparators CMPp are used, the common-mode voltage having, for example, the upper limit which can meet the adequate range for the speed may be found.

In the example FIG. 16, in order to more effectively balance the speed and the accuracy, the gate widths W1 and W2 are made different to achieve a difference "W1<W2". Specifically, when the gate width is small, the high-speed operation is achieved while noises are large, and eventually, the high accuracy is made difficult. To the contrary, when the gate width is large, the high-speed operation is made difficult while the noises are small, and eventually, the high accuracy is achieved. When the gate width is small, the adequate common-mode voltage is relatively high. When the gate width is large, the common-mode voltage are relatively low.

Principal Effects of Third Embodiment

Even by use of the system according to the third embodiment, the similar effects to various effects of the first embodiment, which is typically the high speed of the analog-digital converter ADC, can be achieved. In addition to this, the system according to the third embodiment can suppress the excessive high speed and achieve the high accuracy of the analog-digital converter ADC by the degree of the suppression.

In the foregoing, the invention made by the inventors of the present application has been concretely described on the basis of the embodiments. However, it is needless to say that the present invention is not limited to the foregoing embodiments, and various modifications can be made within the scope of the present invention.

What is claimed is:

1. A semiconductor device comprising:

a voltage quantizer circuit converting differential input voltages to be applied to differential input nodes, into a digital signal with a plurality of bits for every sampling period, and asserting a conversion end signal when completing a conversion operation;

a correction code decision circuit being electrically connected to the voltage quantizer circuit, and receiving the conversion end signal as its input output from the voltage quantizer circuit; and a common-mode voltage regulator circuit being electrically connected to the correction code decision circuit and the voltage quantizer circuit, wherein the voltage quantizer circuit includes:

a first comparator including a first input transistor receiving the differential input voltages as its input, and defining a value of a first bit of the digital signal; and a second comparator including a second input transistor receiving the differential input voltages as its input, being different from the first input transistor, and defining a value of a second bit of the digital signal, the correction code decision circuit decides a correction code for correcting a common-mode voltage of the differential input voltages based on the conversion end signal output from the voltage quantizer circuit, and the common-mode voltage regulator circuit regulates the common-mode voltage by adding or subtracting a corrected voltage based on the correction code to or from the differential input voltages.

2. The semiconductor device according to claim 1, wherein the voltage quantizer circuit further includes:

a sampling switch sampling an external analog input voltage to the differential input nodes; and a digital-analog converter updating the differential input voltages by adding or subtracting a predetermined voltage to or from the differential input voltages in accordance with the value of the first bit, and the second comparator receives the differential input voltages updated by the digital-analog converter, as its input.

3. The semiconductor device according to claim 1, wherein, the correction code decision circuit changes the correction code when detecting the sampling period in which the conversion end signal is not asserted.

4. The semiconductor device according to claim 3, wherein the correction code decision circuit changes the correction code until not detecting the sampling period in which the conversion end signal is not asserted.

5. The semiconductor device according to claim 3, wherein the correction code decision circuit and the common-mode voltage regulator circuit operate on a background in a period in which the voltage quantizer circuit performs a normal operation.

6. The semiconductor device according to claim 5, wherein the correction code decision circuit and the common-mode voltage regulator circuit operate by causing the voltage quantizer circuit to sample an initial value of an external analog input voltage in a correction period included in a period in which the voltage quantizer circuit does not perform the normal operation.

7. The semiconductor device according to claim 2, wherein the common-mode voltage regulator circuit includes a plurality of correction capacitors electrically connected to the differential input nodes, and regulates the common-mode voltage by redistributing charges of the differential input nodes by use of a correction capacitor defined based on the correction code among the plurality of correction capacitors.

8. The semiconductor device according to claim 1, wherein one of the first input transistor and the second input transistor is a p-channel transistor while the other of the first input transistor and the second input transistor is an n-channel transistor.

9. The semiconductor device according to claim 2, wherein both the first input transistor and the second input transistor are p-channel transistors or n-channel transistors, and a gate width of the first input transistor is smaller than a gate width of the second input transistor.

10. The semiconductor device according to claim 7, wherein the digital-analog converter includes a plurality of conversion capacitors electrically connected to the differential input nodes, and updates the differential input voltages by redistributing charges of the differential input nodes by use of a conversion capacitor corresponding to the first bit among the plurality of conversion capacitors, and the semiconductor device further includes:

two sampling capacitors each having a first electrode electrically connected to the differential input nodes and a second electrode electrically connected to the sampling switch;

a first switch applying a predetermined power voltage to the differential input nodes when being turned ON; and a second switch making short circuit between the second electrodes of the two sampling capacitors when being turned ON.

11. A semiconductor device comprising:

a baseband processing circuit performing a processing in a baseband of wireless communication;

a high-frequency circuit performing a processing in a high-frequency band of the wireless communication, and including a high-frequency transmission circuit processing a transmission signal and a high-frequency reception circuit processing a reception signal by use of an analog-digital conversion unit; and a processor connected to the baseband processing circuit via a bus, wherein the analog-digital conversion unit includes:

a voltage quantizer circuit converting differential input voltages to be applied to differential input nodes, into a digital signal with a plurality of bits for every sampling period, and asserting a conversion end signal when completing a conversion operation;

a correction code decision circuit being electrically connected to the voltage quantizer circuit and receiving the conversion end signal as its input output from the voltage quantizer circuit; and a common-mode voltage regulator circuit electrically connected to the correction code decision circuit and the voltage quantizer circuit, the voltage quantizer circuit includes:

a first comparator including a first input transistor receiving the differential input voltages as its input, and defining a value of a first bit of the digital signal; and a second comparator including a second input transistor receiving the differential input voltages as its input, being different from the first input transistor, and defining a value of a second bit of the digital signal, the correction code decision circuit decides a correction code for correcting a common-mode voltage of the differential input voltages, based on the conversion end signal output from the voltage quantizer circuit, and the common-mode voltage regulator circuit regulates the common-mode voltage by adding or subtracting a corrected voltage based on the correction code to or from the differential input voltages.

12. The semiconductor device according to claim 11, wherein the voltage quantizer circuit further includes:

a sampling switch sampling an external analog input voltage for the differential input nodes; and a digital-analog converter updating the differential input voltages by adding or subtracting a predetermined voltage to or from the differential input voltages in accordance with the value of the first bit, and the second comparator receives the differential input voltages updated by the digital-analog converter, as its input.

13. The semiconductor device according to claim 11, wherein the correction code decision circuit changes the correction code when detecting the sampling period in which the conversion end signal is not asserted.

14. The semiconductor device according to claim 13, wherein the correction code decision circuit changes the correction code until not detecting the sampling period in which the conversion end signal is not asserted.

15. The semiconductor device according to claim 13, wherein the correction code decision circuit and the common-mode voltage regulator circuit operate on a background in a period in which the voltage quantizer circuit performs a normal operation.

16. The semiconductor device according to claim 12, wherein the common-mode voltage regulator circuit includes a plurality of correction capacitors electrically connected to the differential input nodes, and regulates the common-mode voltage by redistributing charges of the differential input nodes by use of a correction capacitor defined based on the correction code among the plurality of correction capacitors.

17. The semiconductor device according to claim 11, wherein one of the first input transistor and the second input transistor is a p-channel transistor while the other of the first input transistor and the second input transistor is an n-channel transistor.

18. The semiconductor device according to claim 12, wherein both the first input transistor and the second input transistor are p-channel transistors or n-channel transistors, and a gate width of the first input transistor is smaller than a gate width of the second input transistor.

19. The semiconductor device according to claim 11, wherein the wireless communication is communication based on an ultra wide band (UWB) standard.

* * * * *